(12) United States Patent
Hirakata et al.

(10) Patent No.: US 6,812,082 B2
(45) Date of Patent: Nov. 2, 2004

(54) SEMICONDUCTOR DEVICE AND MANUFACTURING METHOD THEREOF

(75) Inventors: Yoshiharu Hirakata, Kanagawa (JP); Takeshi Fukada, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 10/656,170

(22) Filed: Sep. 8, 2003

(65) Prior Publication Data

US 2004/0048408 A1 Mar. 11, 2004

Related U.S. Application Data

(62) Division of application No. 09/730,417, filed on Dec. 4, 2000, now Pat. No. 6,617,645, which is a continuation of application No. 09/046,198, filed on Mar. 23, 1998, now Pat. No. 6,163,055.

(30) Foreign Application Priority Data

Mar. 24, 1997 (JP) ............................................. 9-090245
Mar. 24, 1997 (JP) ............................................. 9-090246

(51) Int. Cl.7 .................... H01L 21/336; H01L 21/8234
(52) U.S. Cl. ...................................... 438/197; 438/680
(58) Field of Search ........................ 438/30, 197, 142, 438/149, 153, 154, 204, 205, 481–483, 235, 236, 309, 680, 689, 692, 706, 712, 203, 745

(56) References Cited

U.S. PATENT DOCUMENTS

| | | | |
|---|---|---|---|
| 5,117,299 A | 5/1992 | Kondo et al. | |
| 5,132,676 A | 7/1992 | Kimura et al. | |
| 5,214,416 A | 5/1993 | Kondo et al. | |
| 5,240,801 A | 8/1993 | Hayashi et al. | |
| 5,330,616 A | 7/1994 | Yamazaki | |
| 5,583,369 A | 12/1996 | Yamazaki et al. | |
| 5,592,318 A | * 1/1997 | Majima et al. | ............. 349/122 |
| 5,766,696 A | 6/1998 | Itoh | |
| 5,820,947 A | 10/1998 | Itoh | |
| 5,871,847 A | 2/1999 | Itoh | |
| 5,946,561 A | 8/1999 | Yamazaki et al. | |
| 5,949,107 A | 9/1999 | Zhang | |
| 5,989,672 A | 11/1999 | Hayashi | |
| 6,037,197 A | 3/2000 | Yamazaki et al. | |
| 6,049,364 A | 4/2000 | Takahara et al. | |
| 6,091,081 A | * 7/2000 | Matsubara et al. | ........... 257/52 |
| 6,110,542 A | 8/2000 | Miyanaga et al. | |
| 6,115,090 A | 9/2000 | Yamazaki | |
| 6,163,055 A | * 12/2000 | Hirakata et al. | ............ 257/347 |
| 6,171,674 B1 | 1/2001 | Yamazaki et al. | |
| 6,217,661 B1 | 4/2001 | Hirose et al. | |
| 6,617,645 B2 | * 9/2003 | Hirakata et al. | ............ 257/347 |

FOREIGN PATENT DOCUMENTS

JP    07-294958    11/1995

OTHER PUBLICATIONS

Singh et al.; "Use of black diamond–like carbon films as a contrast enhancement layer for liquid–crystal displays"; *Appl. Phys. Lett.* 57(22); Nov. 26, 1990.

* cited by examiner

*Primary Examiner*—David Nhu
(74) *Attorney, Agent, or Firm*—Fish & Richardson P.C.

(57) ABSTRACT

An interlayer insulating film (104) that is formed on a substrate (101) so as to cover TFTs (102, 103) is planarized by mechanical polishing that is typified by CMP. Pixel electrodes (106, 107) are formed on the interlayer insulating film (104) and an insulating layer (108) is formed so as to cover the pixel electrodes. The insulating layer (108) is planarized by second mechanical polishing so that the surfaces of the pixel electrodes become flush with those of resulting buried insulating layers (112, 113). Since the pixel electrode surfaces have no steps, such problems as alignment failures of a liquid crystal material and a contrast reduction due to diffused reflection of light can be prevented.

44 Claims, 16 Drawing Sheets

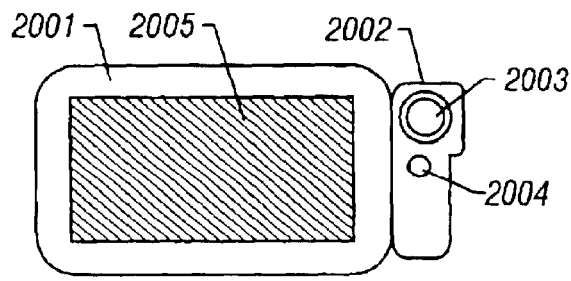
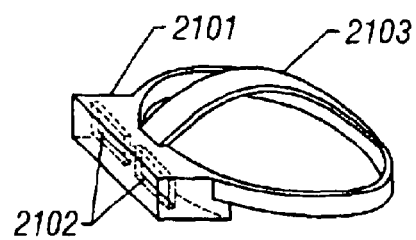
FIG. 20A  FIG. 20B
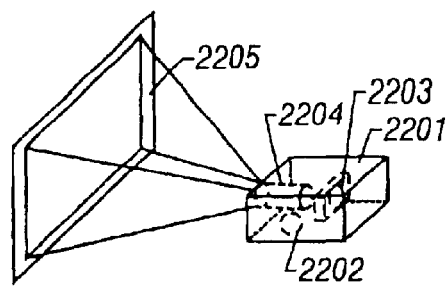
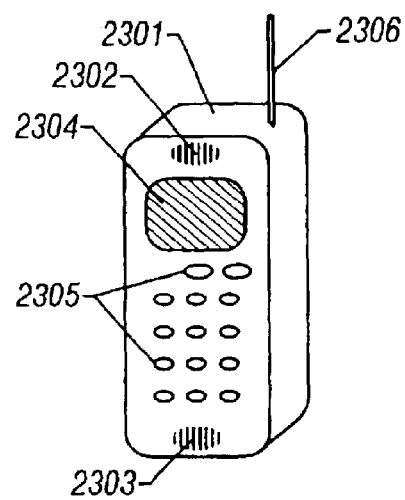
FIG. 20C  FIG. 20D
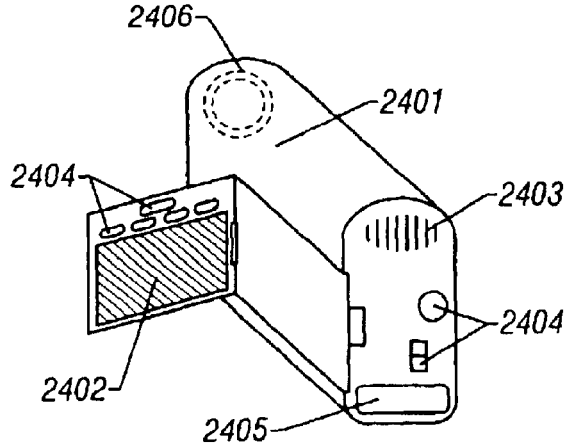
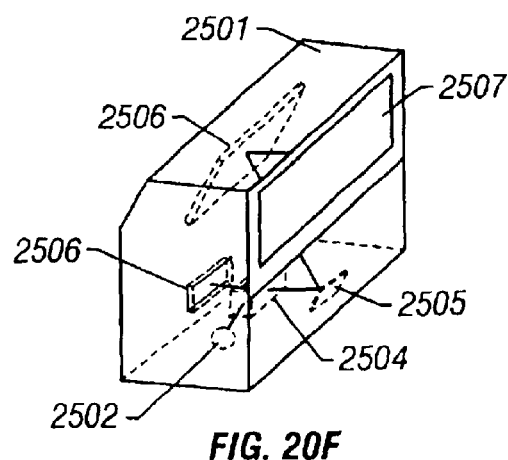
FIG. 20E  FIG. 20F

SEMICONDUCTOR DEVICE AND MANUFACTURING METHOD THEREOF

CROSS-REFERENCE TO RELATED APPLICATIONS

This application is a divisional application of U.S. application Ser. No. 09/730,417, filed on Dec. 4, 2000, now U.S. Pat. No. 6,617,645, which is a continuation of U.S. application Ser. No. 09/046,198, filed on Mar. 23, 1998, now U.S. Pat. No. 6,163,055, which claim the benefit of foreign priority applications filed in Japan, Application Nos. 09-090245, filed on Mar. 24, 1997 and 09-090246, filed on Mar. 24, 1997; all of which are incorporated by reference.

BACKGROUND OF THE INVENTION

1. Field of the Invention

The present invention relates to a manufacturing method of a liquid crystal display device (LCD), in particular, an active matrix liquid crystal display device (hereinafter abbreviated as AM-LCD) that uses a semiconductor thin film. The invention can be applied to an electro-optical device having such a display device.

2. Description of the Related Art

In this specification, the term "semiconductor device" means every device that functions by using a semiconductor. Therefore, each of the above-mentioned display device and electro-optical device is included in the scope of the semiconductor device. However, in this specification, the terms "display device" and "electro-optical device" are used for the sake of discrimination.

In recent years, projectors or the like that use an AM-LCD as a projection-type display have been developed extensively. Further, the demand for AM-LCDs as direct-view displays for mobile computers and video cameras is now increasing.

FIGS. 2A and 2B schematically show the configuration of a pixel matrix circuit in a conventional AM-LCD. The pixel matrix circuit, which constitutes an image display area of the AM-LCD, is a circuit in which thin-film transistors (TFTs) for controlling electric fields applied to a liquid crystal are arranged in matrix form.

FIG. 2A is a top view of the pixel matrix circuit. The regions that are enclosed by a plurality of gate lines 201 extending in the horizontal direction and a plurality of source lines 202 extending in the vertical direction are pixel regions. TFTs 203 are formed at the respective intersections of the gate lines 201 and the source lines 202. Pixel electrodes 204 are connected to the respective TFTs.

Thus, the pixel matrix circuit consists of a plurality of pixel regions that are enclosed by the gate lines 201 and the source lines 202 and are thereby arranged in matrix form, and each pixel region is provided with a TFT 203 and a pixel electrode 204.

FIG. 2B shows a sectional structure of the pixel matrix circuit. In FIG. 2B, reference numeral 205 denotes a substrate having an insulating surface and numerals 206 and 207 denote pixel TFTs formed on the substrate 205. The pixel TFTs 206 and 207 correspond to the TFTs 203 in FIG. 2A.

Pixel electrodes 208 and 209, which correspond to the pixel electrodes 204 in FIG. 2A, are connected to the respective pixel TFTs 206 and 207. Usually, the pixel electrodes 208 and 209 are obtained by patterning a single metal thin film.

Therefore, the pixel matrix circuit having the conventional structure necessarily includes electrode boundary portions (hereinafter referred to simply as boundary portions) 210 and 211 between the pixel electrodes 208, 209, etc.; there necessarily occur steps corresponding to the film thickness of the pixel electrodes 208 and 209. The steps of this type may cause alignment failures of a liquid crystal material, leading to a disordered display image. Further, diffused reflection at the step portions of incident light may deteriorate the contrast or reduce the efficiency of light utilization.

As seen from FIG. 2B, above the semiconductor elements and the intersections of the wiring lines, the pixel electrodes 208 and 209 are formed so as to reflect their shapes. The steps of this type may also cause the above-mentioned problems.

In particular, the above problems appear more remarkably in projection-type displays for projectors and the like, because an image of a small (about 1 to 2 inches), very-high-resolution display is projected in an enlarged manner.

Conventionally, to deal with the above problems, the contrast ratio is increased by shielding regions where an image may be disordered with a black mask (or a black matrix). In recent years, because the device miniaturization has advanced and hence a high degree of controllability of shield regions is required to provide a large aperture ratio, a configuration in which a black mash is formed on a TFT-side substrate is the mainstream.

However, forming a black mash on a TFT-side substrate causes various problems such as an increased number of patterning steps, an increase in parasitic capacitance, and a decrease in aperture ratio. Therefore, a technique for securing a high contract ratio without causing above-mentioned problems is now desired.

SUMMARY OF THE INVENTION

The present invention has been made in view of above circumstance and therefore, an object of the present invention is to solve the above problems in the art and to thereby enable, with a simple means, formation of a very-high-resolution AM-LCD.

According to a first aspect of the invention, there is provided a manufacturing method of a semiconductor device, comprising the steps of planarizing an insulating film formed on a substrate having an insulating surface; forming a plurality of electrodes on the insulating film; forming an insulating layer so as to cover the plurality of electrodes; and planarizing surfaces of the plurality of electrodes and a surface of the insulating layer so that they become flush with each other, thereby filling boundary portions between the plurality of electrodes with the insulating layer.

There is also provided a manufacturing method of a semiconductor device having a first substrate, a second, transparent substrate, and a liquid crystal layer held between the first and second substrates, comprising the steps of planarizing an insulating film formed on the first substrate; forming striped electrodes on the insulating film; forming an insulating layer so as to cover the striped electrodes; and planarizing surfaces of the striped electrodes and a surface of the insulating layer so that they become flush with each other, thereby filling boundary portions between the striped electrodes with the insulating layer.

There is also provided a manufacturing method of a semiconductor device, comprising the steps of forming a plurality of semiconductor elements on a substrate having an insulating surface; forming an interlayer insulating film; planarizing the interlayer insulating film; forming pixel electrodes that are electrically connected to the respective semiconductor elements on the interlayer insulating film; forming an insulating layer so as to cover the pixel electrodes; and planarizing surfaces of the pixel electrodes and a surface of the insulating layer so that they become flush with each other, thereby filling boundary portions between the pixel electrodes with the insulating layer.

There is further provided a manufacturing method of a semiconductor device having a substrate that has a plurality of semiconductor elements arranged in matrix form and a plurality of pixel electrodes connected to the respective semiconductor elements, and a liquid crystal layer held on the substrate, comprising the steps of forming an interlayer insulating film; planarizing the interlayer insulating film; forming pixel electrodes that are electrically connected to the respective semiconductor elements on the interlayer insulating film; forming an insulating layer so as to cover the pixel electrodes; and planarizing surfaces of the pixel electrodes and a surface of the insulating layer so that they become flush with each other, thereby filling boundary portions between the pixel electrodes with the insulating layer.

According to a second aspect of the invention, there is provided a semiconductor device comprising a plurality of electrodes formed on a substrate having an insulating surface; a DLC film covering the plurality of electrodes; and an insulating layer buried in boundary portions of the plurality of electrodes.

There is also provided a semiconductor device comprising a first substrate; a second, transparent substrate; a liquid crystal layer held between the first and second substrates; striped electrodes formed on each of the first and second substrates; a DLC film covering the striped electrodes; and an insulating layer buried in boundary portions of the striped electrodes.

There is also provided a semiconductor device comprising a plurality of semiconductor elements formed in matrix form on a substrate having an insulating surface; a plurality of pixel electrodes connected to the respective semiconductor elements; a DLC film covering the pixel electrodes; and an insulating layer buried in boundary portions of the pixel electrodes.

There is further provided a semiconductor device comprising a substrate having a plurality of semiconductor elements arranged in matrix form and a plurality of pixel electrodes connected to the respective semiconductor elements; a liquid crystal layer held on the substrate; a DLC film covering the pixel electrodes; and an insulating layer buried in boundary portions of the pixel electrodes.

Still according to the second aspect of the invention, there is provided a manufacturing method of a semiconductor device, comprising the steps of forming a plurality of electrodes on a substrate having an insulating surface; forming a DLC film to cover a plurality of electrodes; forming an insulating layer on the DLC film; and planarizing the insulating layer so that a surface of the DLC film and a surface of the insulating layer become flush with each other, thereby filling boundary portions of the plurality of electrodes with the insulating layer.

There is also provided a manufacturing method of a semiconductor device having a first substrate, a second, transparent substrate, and a liquid crystal layer held between the first and second substrates, comprising the steps of forming striped electrodes on the first substrate; forming a DLC film to cover the striped electrodes; forming an insulating layer on the DLC film; and planarizing the insulating layer so that a surface of the DLC film and a surface of the insulating layer become flush with each other, thereby filling boundary portions of the striped electrodes with the insulating layer.

There is also provided a manufacturing method of a semiconductor device, comprising the steps of forming a plurality of semiconductor elements on a substrate having an insulating surface; forming a plurality of pixel electrodes that are electrically connected to the respective semiconductor elements; forming a DLC film to cover the pixel electrodes; forming an insulating layer on the DLC film; and planarizing the insulating layer so that a surface of the DLC film and a surface of the insulating layer become flush with each other, thereby filling boundary portions of the pixel electrodes with the insulating layer.

There is further provided a manufacturing method of a semiconductor device having a substrate that has a plurality of semiconductor elements arranged in matrix form and a plurality of pixel electrodes connected to the respective semiconductor elements, and a liquid crystal layer held on the substrate, comprising the steps of forming a DLC film to cover the pixel electrodes; forming an insulating layer on the DLC film; and planarizing the insulating layer so that a surface of the DLC film and a surface of the insulating layer become flush with each other, thereby filling boundary portions of the plurality of the pixel electrodes with the insulating layer.

In the above description of the invention, the term DLC is an abbreviation of "diamond-like carbon." A DLC film is therefore a thin film that is made only or mainly of carbon and that exhibits diamondlike physical properties such as high hardness. This material is also called i-carbon and mainly has $sp^3$ bonds.

The hardness (Vickers hardness) of a DLC film is as high as 2,000 kg/mm$^2$ or more and its friction coefficient is 0.4 or less. Therefore, DLC films are used as protection films and lubrication films. However, if the hydrogen content is excessively large, a DLC film becomes too soft to be used in the invention.

A DLC film exhibits a characteristic feature in Raman data. FIG. 18 shows Raman data of a DLC film used in the invention, in which the vertical axis represents relative intensity. A measurement was conducted in the air at the room temperature by using an Ar+ laser (laser beam diameter: 1 $\mu$m; output power: 1.0 mW; slit width: 100 $\mu$m). The accumulation time was 300 sec×2.

As seen from FIG. 18, a DLC film has a broad Raman spectrum extending on both sides of a peak at about 1,550 cm$^{-1}$. The fact that the Raman spectrum is asymmetrical with respect to the peak 1,550 cm$^{-}$is also a feature of a DLC film.

Raman data of diamond has a sharp peak at about 1,330 cm$^{-1}$ and hence is easily distinguished from that of a DLC film. Further, a carbon film that is rendered soft due to loss of a crystal structure (regarded as a different material than a DLC film) has two Raman peaks or no clear Raman peak and hence can easily be distinguished from a DLC film.

In connection with the above description of the invention, a typical example of the liquid crystal layer holding state is such that a liquid crystal layer is held between a substrate (first substrate) having a plurality of pixel electrodes and an opposed substrate (second substrate) that confronts the first substrate. Where a PDLC (polymer dispersion liquid crystal) is used as a liquid crystal layer, there may occur a case that the second substrate is not necessary, because the liquid crystal layer itself is rendered in a solid state.

The typical example of the semiconductor element is a thinfilm transistor (TFT). In addition, the semiconductor element may be an insulated-gate field-effect transistor (IGFET), a thin-film diode, an MIM (metal-insulator-metal) element, a varistor element, or the like.

BRIEF DESCRIPTION OF THE DRAWINGS

FIGS. 20A to 20F show examples of application products according to a thirteenth embodiment of the invention.

DETAILED DESCRIPTION OF THE PREFERRED EMBODIMENTS

First, the present invention will be described briefly with reference to FIGS. 1A to 1C and 10A to 10C.

Figure 1A:
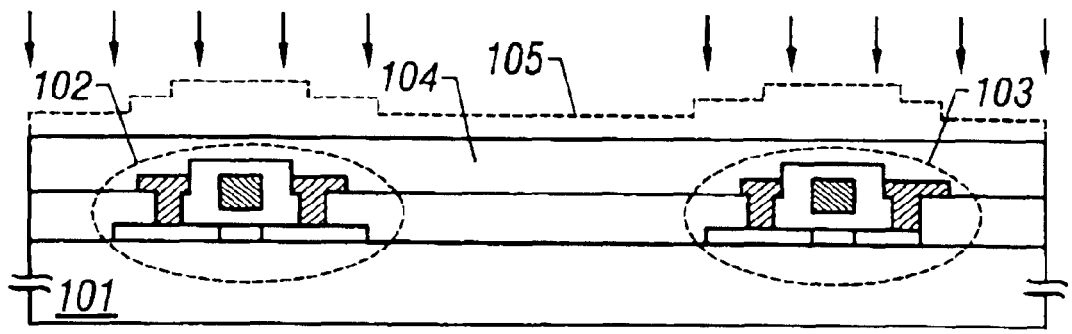
FIGS. 1A to 1C are sectional views for brief description of the present invention.

In FIG. 1A, reference numeral 101 denotes a substrate having an insulating substrate, and numerals 102 and 103 denote first and second pixel TFTs, respectively, formed on the substrate 101. The first and second pixel TFTs 102, 103 are covered with an interlayer insulating film 104, which is an insulating film for electrically insulating the pixel TFTs 102 and 103 from pixel electrodes that will be formed later.

A first feature of a first aspect of the invention is that the interlayer insulating film 104 that has been deposited so as to be thicker than a necessary thickness is subjected to a planarization step (particularly by mechanical polishing). The interlayer insulating film 104 polishing step, which will be described later, will play an important role in forming pixel electrodes later. In FIG. 1A, a broken line 105 represents the shape of the interlayer insulating film 104 before being subjected to the polishing step and indicates that surface asperities of the interlayer insulating film 104 are removed, i.e., the surface is planarized, by the mechanical polishing step.

A typical example of the mechanical polishing is the CMP (chemical mechanical polishing) technique in which the surface of a thin film is planarized by chemical etching with a liquid chemical and mechanical polishing with an abrasive (abrasive grains).

Other than the mechanical polishing, an etch back technique utilizing dry etching may be used. Although the etch back technique is inferior to the CMP technique in flatness attained, it is advantageous in that no additional apparatus is needed and that no particles (dust) occur during processing.

Figure 1B:
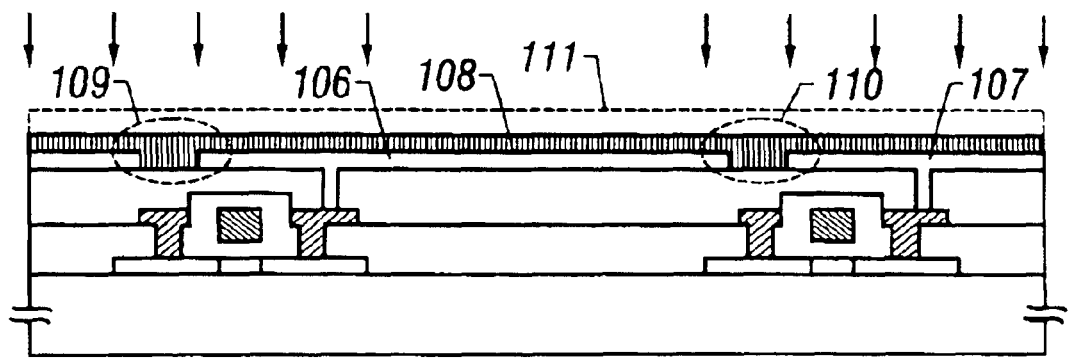

Then, a metal thin film (not shown) is formed on the planarized interlayer insulating film 104 and then patterned into pixel electrodes 106 and 107 (see FIG. 1B). In the first aspect of the invention, since the interlayer insulating film 104 is planarized, the pixel electrodes 106 and 107 thus formed have extremely flat surfaces.

The pixel electrodes 106 and 107 are connected to the respective pixel TFTs 102 and 103 via contact holes. The pixel electrodes 106 and 107 are then covered with an insulating layer 108. At this time, by depositing the insulating film 108 at a larger thickness than a necessary value, boundary portions 109 and 110 are filled in completely.

Figure 1C:
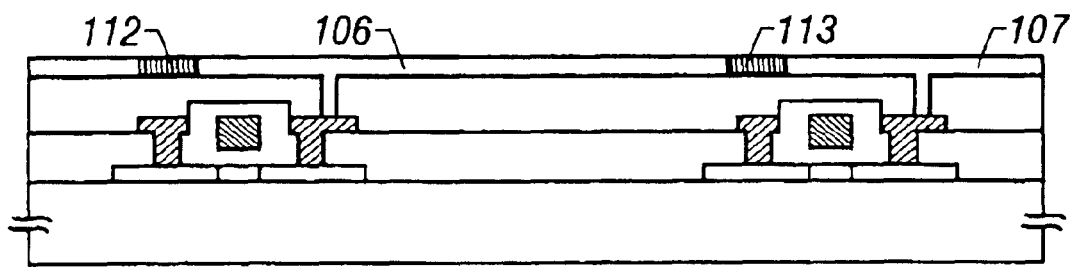
Figure 2A:
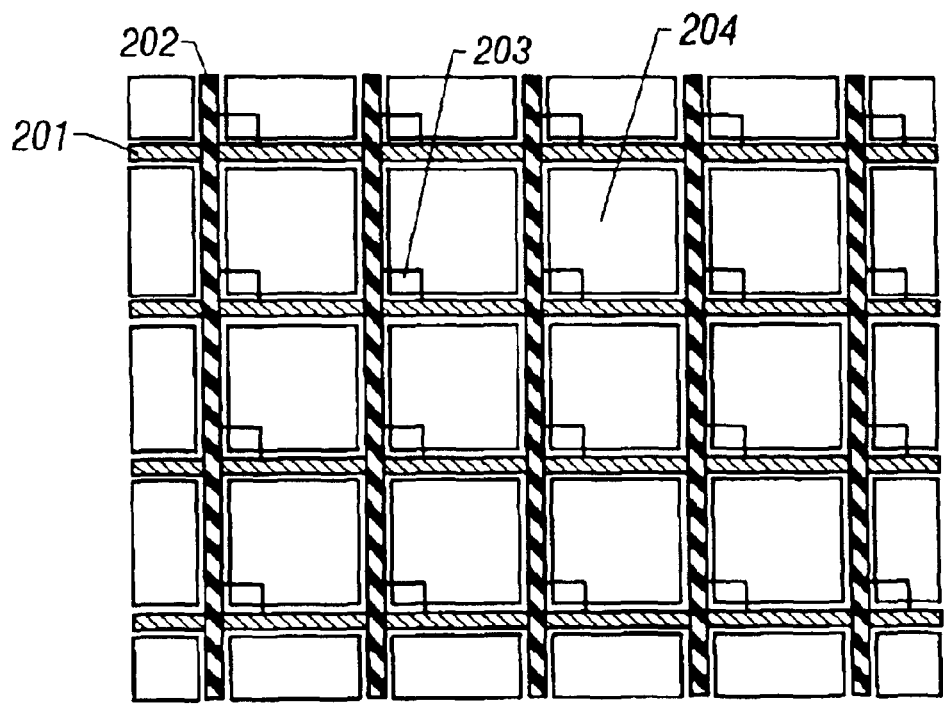
FIGS. 2A and 2B show the configuration of a conventional pixel matrix circuit.
Figure 2B:
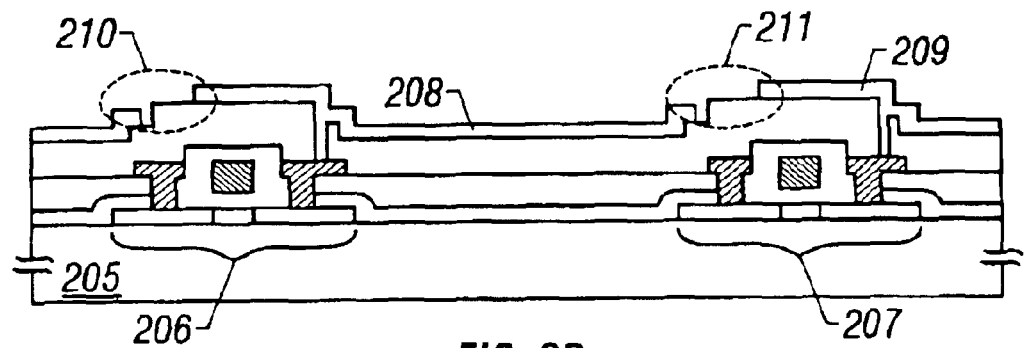

A second feature of the first aspect of the invention is that the insulating layer 108 is mechanically polished to leave parts of the insulating layer 108 only in the boundary portions 109 and 110; buried insulating layers 112 and 113 are formed as shown in FIG. 1C. A broken line 111 shown in FIG. 1B represents the shape of the insulating layer 108 before being subjected to the polishing step and indicates how the insulating layer 108 is ground away by the mechanical polishing step.

The surfaces of the pixel electrodes 106 and 107 appear as the insulating layer 108 is polished in the above manner. Although the state of FIG. 1C can be obtained even if the polishing is stopped at this stage, it is effective to continue the polishing to also planarize the surfaces of the pixel electrodes 106 and 107. In this case, the conditions of the polishing may be modified (for instance, using finer abrasive grains) when necessary to render the surfaces of the pixel electrodes 106 and 107 in best conditions.

In the final state shown in FIG. 1C, the boundary portions 109 and 110 formed between the pixel electrodes 106, 107, etc. are completely filled in by the buried insulating layers 112 and 113. The surfaces of the pixel electrodes 106 and 107 are flush with the surfaces of the buried insulating layers 112 and 113.

In this state, as mentioned above, the first feature of the first aspect of the invention, i.e., the interlayer insulating film 104 polishing step, plays an important role. This will be described below.

For example, if the interlayer insulating film 104 polishing step had not been executed, the shapes of the pixel electrodes 106 and 107 and the insulating film 108 would reflect the shape represented by numeral 105 to a large extent. In general, to increase the aperture ratio, the boundary portions 109 and 110 are necessarily formed on the respective TFTs 102 and 103 (on the source lines).

Therefore, the boundary portions 109 and 110 would become higher than the effective pixel electrode surfaces (the flattest portions of the pixel electrode surfaces that do not coextend with the TFTs 102 and 103 nor the wiring lines).

Therefore, the portions of the pixel electrode surfaces right above the TFTs 102 and 103 would be exposed first as the insulating layer 108 is mechanically polished. When the effective pixel electrode surfaces are polished, the portions of the pixel electrode surfaces right above the TFTs 102 and 103 and the buried insulating layers 112 and 113 would have been polished considerably; it would be difficult to perform polishing uniformly.

It is conceivable to planarize the surface, i.e., remove the asperities that are caused by the TFTs 102 and 103 etc., by depositing the interlayer insulating film 104 at a larger thickness than a necessary value. However, merely depositing such a thick interlayer insulating film 104 necessarily leaves not a little surface asperity such as undulation. To remove such undulation, it is necessary to form the insulating layer 108 at a larger thickness than a necessary value and to execute the mechanical polishing step for a longer time, which will cause problems such as a decrease in throughput and an increase of particles generated.

As described above, planarizing the interlayer insulating film by the mechanical polishing step before formation of the pixel electrodes is a very effective means. That is, although the most important object of the first aspect of the invention is to obtain the state of FIG. 1C by the polishing step of FIG. 1B, the first aspect of the invention is also characterized by the polishing step of FIG. 1A which is executed to allow the polishing step of FIG. 1B to be executed efficiently.

Then, as shown in FIG. 1C, the gaps (boundary portions) between the pixel electrodes are filled in by the buried insulating layers, to eliminate unnecessary steps. As a result, the invention can provide a very-high-resolution AM-LCD that is free of such problems as alignment failures of a liquid crystal material and diffused reflection of light at step portions which problems are associated with conventional AM-LCDs.

Figure 10A:
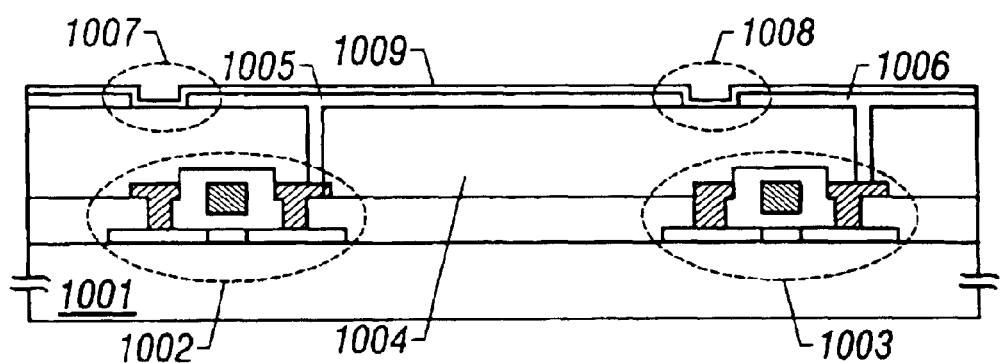
FIGS. 10A to 10C are sectional views for brief description of the invention.

Next, a second aspect of the invention will be described below. In FIG. 10A, reference numeral 1001 denotes a substrate having an insulating surface and numerals 1002 and 1003 denote pixel TFTs formed on the substrate 1001. Pixel electrodes 1005 and 1006 are formed on the respective pixel TFTs 1002 and 1003 with an interlayer insulating film 1004 interposed in between. The pixel electrodes 1005 and 1006 are electrically connected to the respective pixel TFTs 1002 and 1003, and are electrically insulated from each other at boundary portions 1007 and 1008.

The feature of the second aspect of the invention is that a DLC film 1009 of 10 to 50 nm in thickness is formed so as to cover the pixel electrodes 1005 and 1006. After the state of FIG. 10A is obtained, an insulating layer 1010 for filling in the boundary portions 1007 and 1008 of the pixel electrodes 1005 and 1006 over the pixel electrodes 1005 and 1006. If the insulating layer 1010 is a light interruptive thin film (for instance, a light absorption layer), it can serve as a black mask.

Figure 10B:
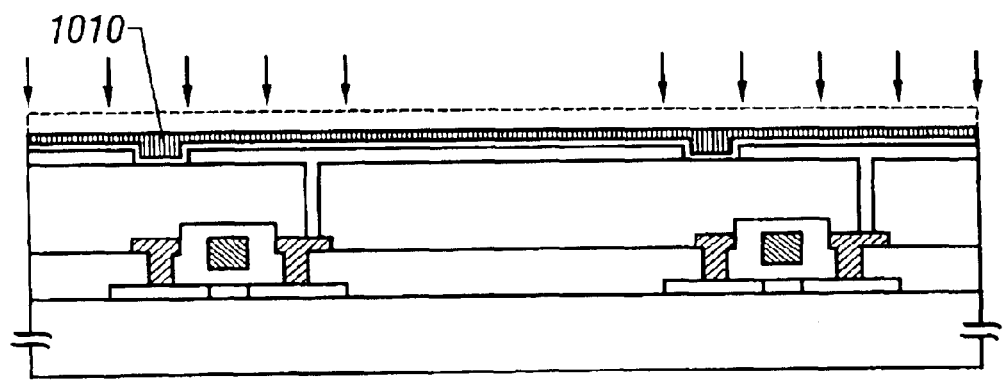

Then, as shown in FIG. 10B, the insulating layer 1010 is subjected to a planarization process. Mechanical polishing is a typical, effective method. A typical example of mechanical polishing is the CMP (chemical mechanical polishing) technique in which the surface of a thin film is planarized by chemical etching with a liquid chemical and mechanical polishing with an abrasive (abrasive grains), and which can produce a superior flat surface.

Other than the mechanical polishing, an etch back technique utilizing dry etching may be used. Although the etch back technique is inferior to the CMP technique in flatness attained, it is advantageous in that no additional apparatus is needed and that no particles (dust) occur during processing.

In the second aspect of the invention, the surface of the DLC film 1009 appears as the polishing of the insulating layer 1010 proceeds. Since the DLC film 1009 is very high in hardness, the mechanical polishing does not proceed any further. That is, the planarization step is completed at the time point that the DLC film has appeared.

Figure 10C:
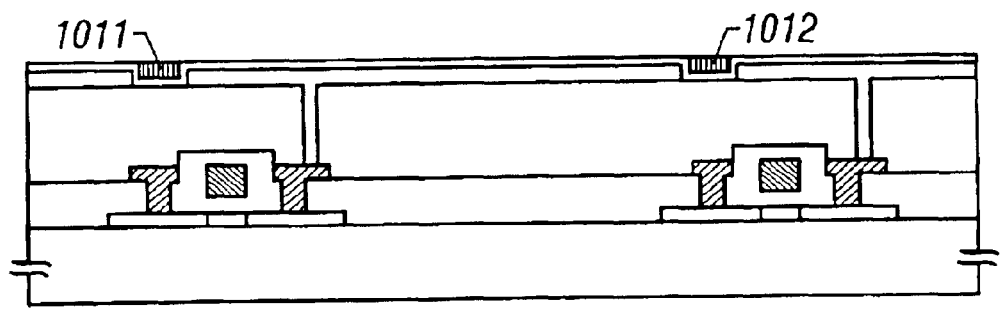

As a result of the above planarization step, buried insulating layers 1011 and 1012 are formed as shown in FIG. 10C. A broken line in FIG. 10B represents the shape of the insulating layer 1010 before being subjected to the polishing step, and indicates how the insulating layer 1010 is ground away by the mechanical polishing step.

In the final state shown in FIG. 10C, the boundary portions 1007 and 1008 formed between the pixel electrodes are completely filled in by the buried insulating layers 1011 and 1012. The surfaces of the pixel electrodes 1005 and 1006 are flush with the surfaces of the buried insulating layers 1011 and 1012.

As described above, according to the second aspect of the invention, the boundary portions between the pixel electrodes are filled in by the buried insulating layers, whereby unnecessary steps are eliminated. As a result, there can be provided a very-high-resolution AM-LCD that is free of such problems as alignment failures of a liquid crystal material and diffused reflection of light at step portions which problems are associated with conventional AM-LCDs.

Embodiment 1

In this embodiment, an example process of manufacturing a pixel matrix circuit of a reflection-type LCD by utilizing the first aspect of the invention will be described with reference to FIGS. 3A to 3D and 4A to 4C. Since the invention is directed to the technique relating to planarization of pixels, the TFT structure itself is not limited to that in this embodiment.

First, a substrate 301 having an insulating surface is prepared. In this embodiment, a silicon oxide film as an undercoat film is formed on a glass substrate. Then, active layers 302 to 304 that are crystalline silicon films are formed on the substrate 301. Although only three TFTs will be described in this embodiment, actually million or more TFTs are formed in a pixel matrix circuit.

In this embodiment, a crystalline silicon film is obtained by thermally crystallizing an amorphous silicon film. The crystalline silicon film is patterned into the active layers 302 to 304 by an ordinary photolithography method. In this embodiment, a catalyst element (nickel) for accelerating crystallization is added in the crystallization step. This technique is described in detail in Japanese Unexamined Patent Publication No. Hei. 7-130652.

Then, a 150-nm-thick silicon oxide film is formed as a gate insulating film 305. An aluminum film (not shown) containing scandium at 0.2 wt % is formed thereon and patterned into island-like patterns as starting members of gate electrodes.

At this stage, in this embodiment, a technique disclosed in Japanese Unexamined Patent Publication No. Hei. 7-135318 is utilized. For details, refer to this publication.

First, anodization is performed in a 3%-aqueous solution of oxalic acid in a state that the resist mask that was used in the patterning is left on the island-like patterns. A platinum electrode is used as the cathode, the formation current is set at 2 to 3 mA, and the final voltage is set at 8 V. In this manner, porous anodic oxide films 306 to 308 are formed.

After the resist mask is removed, anodization is again performed in a solution obtained by neutralizing 3%-ethylene glycol solution of tartaric acid with aqueous ammonia. The formation current and the final voltage may be set at 5 to 6 mA and 100 V, respectively. Dense anodic oxide films 309 to 311 are thus formed.

Figure 3A:
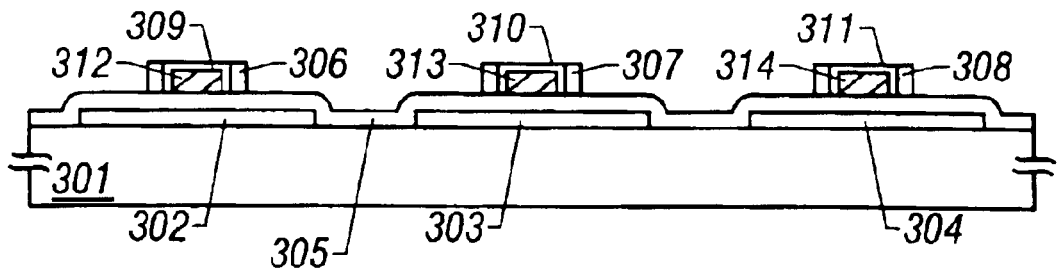
FIGS. 3A to 3D and 4A to 4C show a process of manufacturing a reflection-type LCD according to a first embodiment of the invention.

Gate electrodes 312 to 314 are defined by the above step (see FIG. 3A). In the pixel matrix circuit, gate lines for connecting the gate electrodes are formed every other line at the same as the gate electrodes are.

Thereafter, the gate insulating film 305 is etched by using the gate electrodes 312 to 314 as a mask by dry etching that uses a $CF_4$ gas. Gate insulating films 315 to 317 are thus formed so as to have shapes shown in FIG. 3B.

In this state, impurity ions for imparting one conductivity type are added by ion implantation or plasma doping. P (phosphorus) ions may be added if the pixel matrix circuit is to be constituted of n-type TFTs and B (boron) ions may added if it is to be constituted of p-type TFTs.

The above ion addition step is performed in two steps. In the first step, the acceleration voltage is set as high as about 80 kV so that a peak of an impurity ion profile is located at the portions under the end portions (projected portions) of the gate insulating films 315 to 317. In the second step, the acceleration voltage is set as low as about 5 kV so that so that impurity ions are not added to the portions under the end portions of the gate insulating films 315 to 317.

Figure 3B:
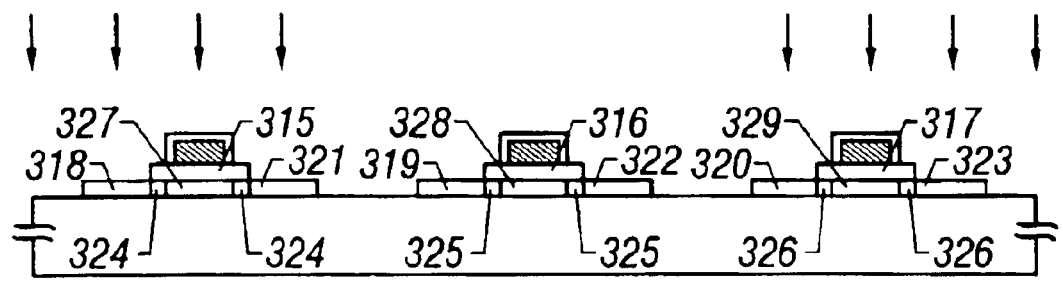

As a result, source regions 318 to 320, drain regions 321 to 323, low-concentration impurity regions (LDD regions) 324 to 326, and channel forming regions 327 to 329 of TFTs are formed (see FIG. 3B).

It is preferred that impurity ions be added to the source regions 318 to 320 and the drain regions 321 to 323 so that a sheet resistance of 300 to 500 $\Omega/\square$ is obtained there. It is necessary to optimize the impurity concentration of the low-concentration impurity regions 324 to 326 in accordance with the performance of the TFTs needed. After completion of the impurity ions addition step, a heat treatment is performed to activate the impurity ions.

Figure 3C:
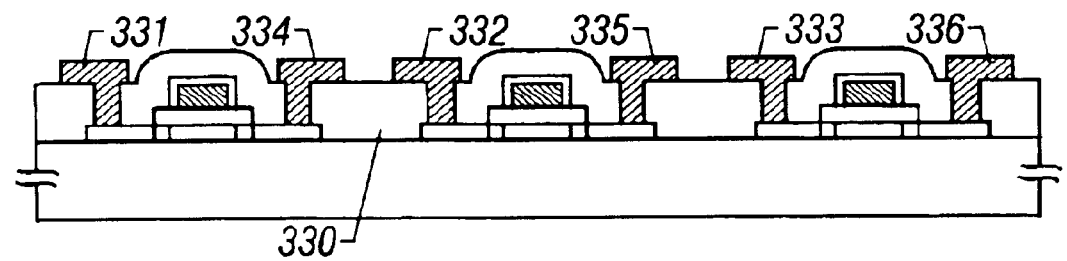

Then, a 400-nm-thick silicon oxide film is formed as a first interlayer insulating film 330, and source electrodes 331 to 333 and drain electrodes 334 to 336 are formed therethrough (see FIG. 3C).

Thereafter, a silicon oxide film of 0.5 to 1 $\mu$m is formed as a second interlayer insulating film 337. Forming a dense silicon oxide film by using a high-density plasma source, for instance, is preferred because the flatness attained by a later CMP step is improved. The second interlayer insulting film 337 may be an organic resin film on condition that the conditions of the CMP step is optimized. Examples of materials of the organic resin film are polyimide, polyamide, polyimideamide, and acrylic.

After the formation of the second interlayer insulating film 337, a first CMP step is executed. The second interlayer insulating film 337 is planarized by this step, whereby a flat surface without asperities can be obtained (see FIG. 3D).

Subsequently, a 100-nm-thick aluminum film containing titanium at 1 wt % is formed and then patterned into pixel electrodes 338 to 340. Naturally other metal materials may be used.

Then, an insulating layer 341 is formed so as to cover the pixel electrodes 338 to 340. Where the pixel electrodes are formed in such a manner that the boundary portions are located above the source lines 331 to 333 as in the case of this embodiment, the source lines 331 to 333 serve as a black mask. Therefore, the insulating layer 341 may be transparent.

However, to secure the light interrupting function more reliably, it is desirable that a light interruptive insulating film such as an organic resin film in which a black pigment or carbon is dispersed (a solution-application-type silicon oxide film such as PSG) be used as the insulating layer 341. With this measure, the light interrupting function can be attained reliably even in a case where the source lines 331 to 333 are narrow or incident light comes obliquely.

By making the relative dielectric constant of the material of the insulating layer 341 smaller than that of a liquid crystal used by as large a margin as possible, lateral electric fields developing between the pixel electrodes 338 to 340 can be reduced.

Figure 4A:
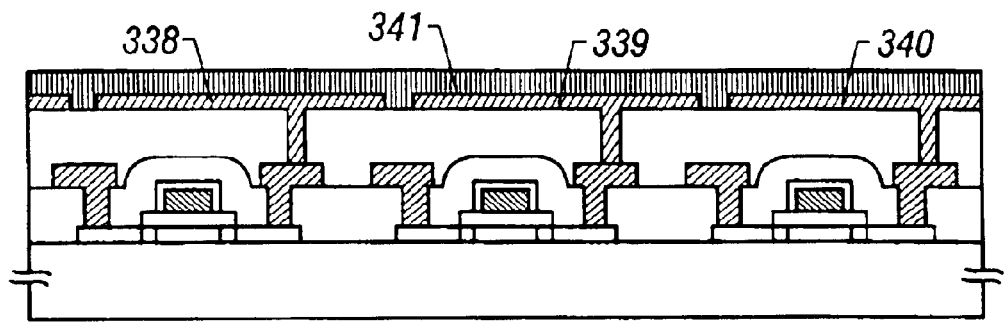

The state of FIG. 4A is thus obtained. In this state, a second CMP step is executed whereby buried insulating layers 342 to 344 are formed so as to be buried in the gaps between the pixel electrodes 338 to 340. Since the surfaces of the pixel electrodes 338 to 340 are approximately flush with the surfaces of the buried insulating layers 342 to 344, a superior flat surface can be obtained (see FIG. 4B).

Figure 4B:
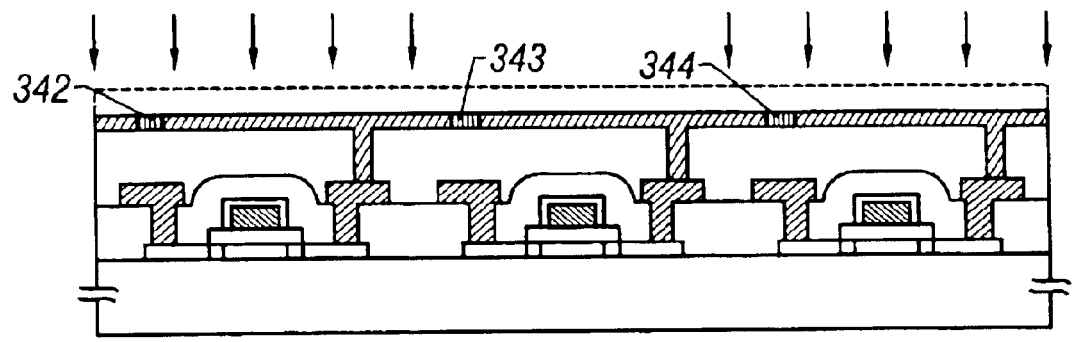
Figure 6:
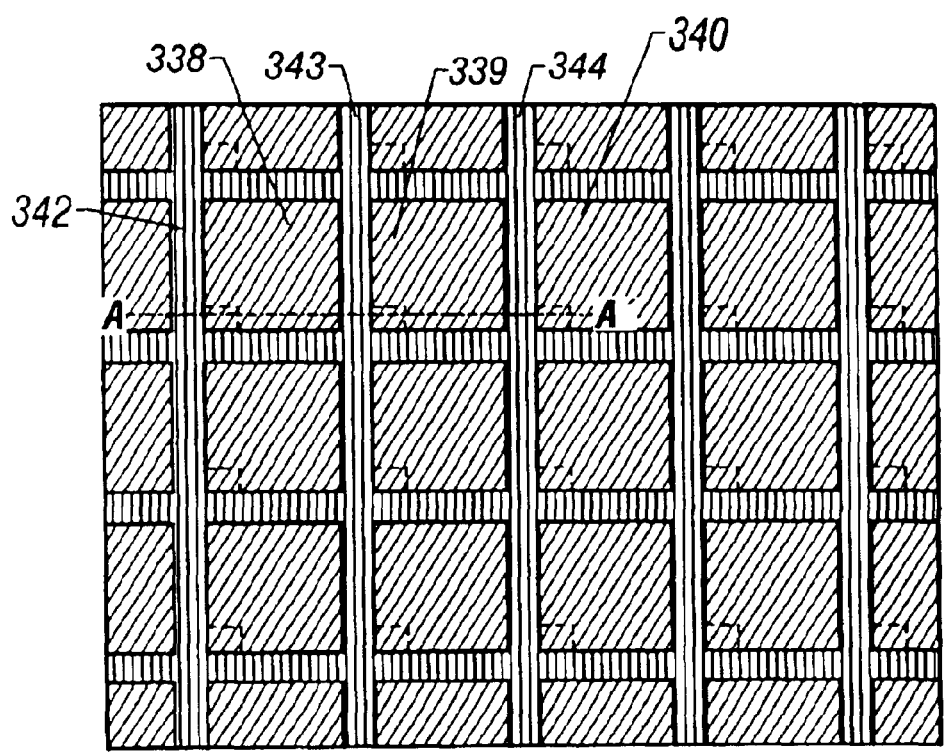
FIG. 6 is a top view of a pixel matrix circuit according to the first embodiment.

FIG. 6 is a simplified top view of the pixel matrix circuit in this state. FIG. 4B is a sectional view taken along line A–A' in FIG. 6. The reference numerals used in FIG. 6 are the same as in FIGS. 4A and 4B.

As shown in FIG. 6, the pixel electrodes 338 to 340 etc. are arranged in matrix form and the gaps between those are buried by the buried insulating layers 342 to 344 etc. Therefore, although the buried insulating layers 342 to 344 are denoted by separate reference numerals, they are integral with each other and have a grid-like shape.

The pixel matrix circuit is completed in the above manner. Actually, driver circuits for driving the pixel TFTs and other circuits are also formed on the same substrate at the same time. This type of substrate is usually called a TFT-side substrate or an active matrix substrate. In this specification, this substrate is called a first substrate.

Figure 4C:
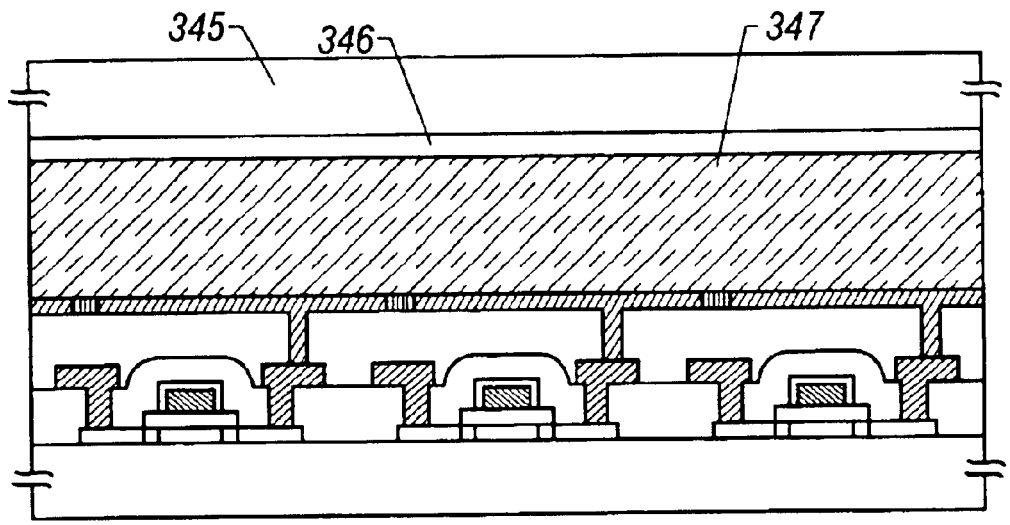

After the completion of the first substrate, an opposed substrate (called a second substrate in this specification) in which an opposed electrode 346 is formed on a transparent substrate 345 is bonded to the first substrate and a liquid crystal layer 347 is held between the first and second substrates. A reflection-type LCD is thus completed as shown in FIG. 4C.

The above cell assembling may be performed according to a known method. It is possible to disperse a dichroic dye in the liquid crystal layer 347 or provide color filters on the opposed substrate. The kind of liquid crystal layer 347, the use of color filters, and other factors may be determined properly by a party who practices the invention because they depend on the mode of driving the liquid crystal.

Embodiment 2

In this embodiment, an example process of manufacturing a pixel matrix circuit of a transmission-type LCD by utilizing the first aspect of the invention will be described with reference to FIGS. 5A to 5C. Since the manufacturing process of this embodiment is the same as that of the first embodiment to a certain intermediate step, only different points between the two processes will be described below.

Figure 3D:
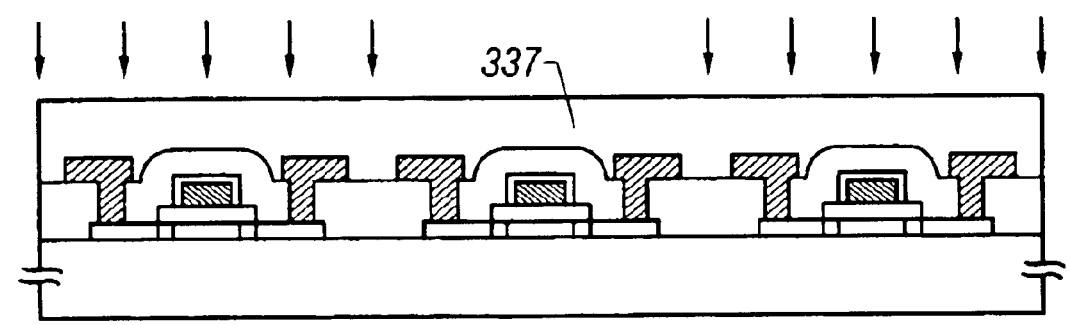
Figure 5A:
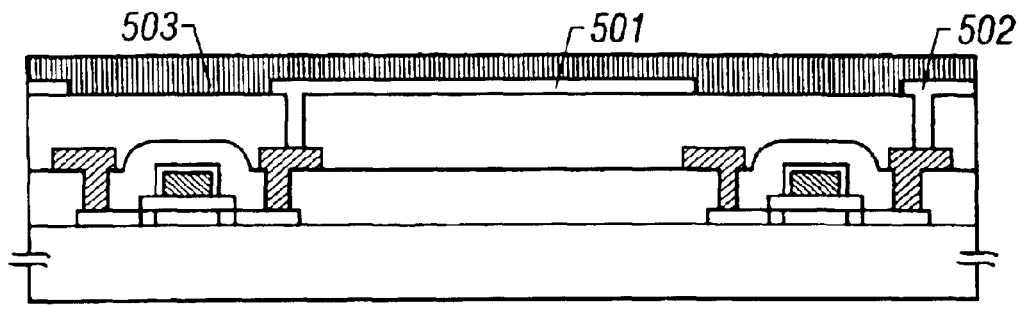
FIGS. 5A to 5C show a process of manufacturing a transmission type LCD according to a second embodiment of the invention.
Figure 5B:
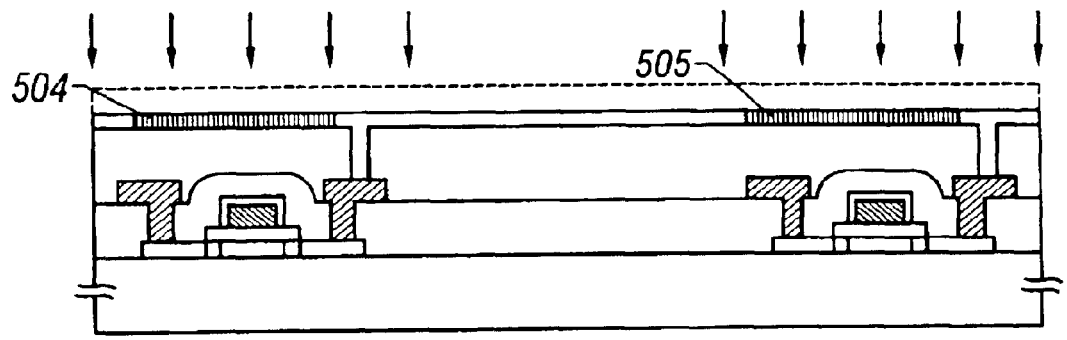
Figure 5C:
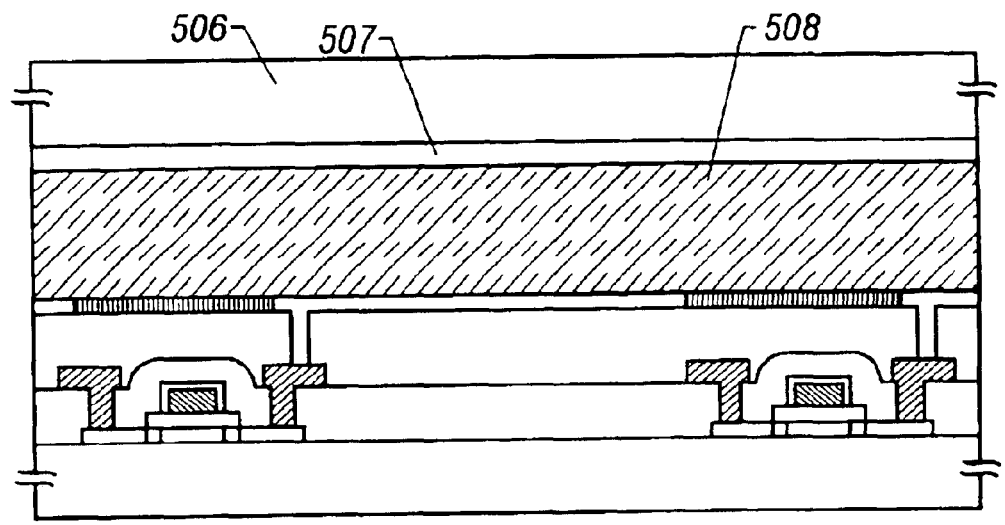

After the completion of the first CMP step shown in FIG. 3D, pixel electrodes 501 and 502 are formed as shown in FIG. 5A. In this embodiment, the pixel electrodes 501 and 502 are transparent conductive films (made of ITO, $SnO_2$, or the like). The pixel electrodes 501 and 502 are formed so as not to overlap with the TFTs.

Then, an insulating layer 503 is formed so as to cover the pixel electrodes 501 and 502 (see FIG. 5A). In this embodiment, for example, polyimide in which a black pigment is dispersed is used as the insulating layer 503. Since the active layers of the TFTs also need to be shielded from light in the case of the transmission type, it is preferred to use a light interruptive insulating film as the insulating layer 503.

Subsequently, a second CMP step is executed whereby buried insulating layers 504 and 505 are formed so as to be flush with the pixel electrodes 501 and 502 (see FIG. 5B).

Figure 7:
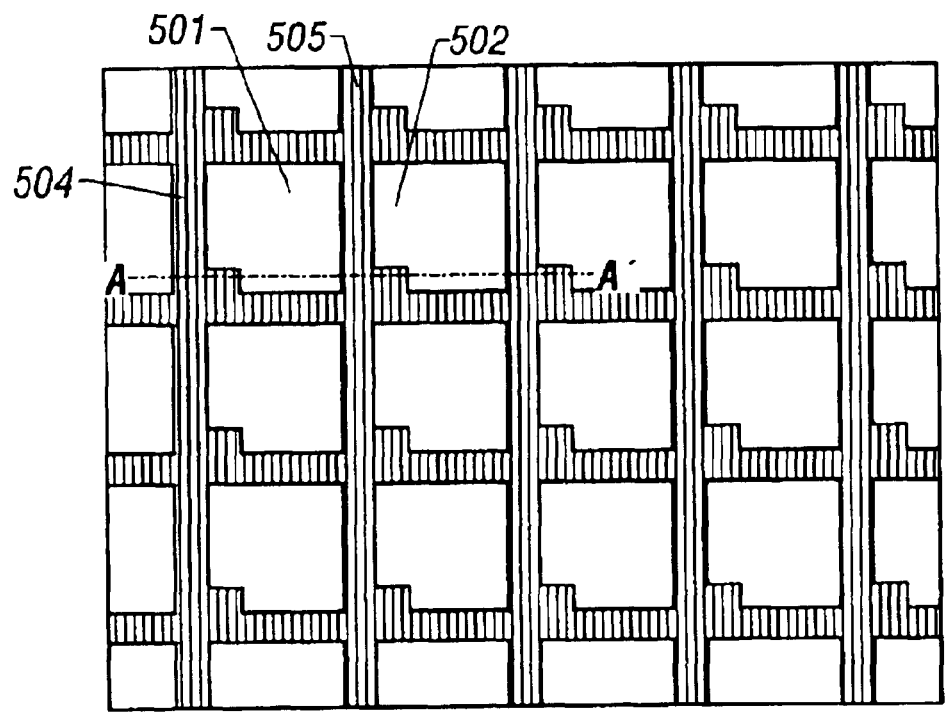
FIG. 7 is a top view of a pixel matrix circuit according to the second embodiment.

FIG. 7 is a simplified top view of the pixel matrix circuit in this state. FIG. 5B is a sectional view taken along line A–A' in FIG. 7. The reference numerals used in FIG. 7 are the same as in FIGS. 5A and 5B.

As shown in FIG. 7, the pixel electrodes 501, 502, etc. are arranged in matrix form and the gaps between those are filled in by the integral buried insulating layers 504, 505, etc. In this embodiment, the buried insulating layers also formed over the TFTs provide an advantage of preventing a resistance variation that would otherwise be caused by light incident on the active layers.

A TFT-side substrate of a transparent-type LCD is completed in the above manner. After the completion of the TFT-side substrate, an ordinary cell assembling step is executed whereby a liquid crystal layer 508 is held between the TFT-side substrate and an opposed substrate that is composed of a transparent substrate 506 and an opposed electrode 507. A transmission-type LCD is thus completed as shown in FIG. 5C.

In this embodiment, it is effective to planarize the pixel electrodes 501 and 502 themselves by mechanically polishing those. In this case, it is preferable to provide a surface having minute asperities for a direct-view display and a mirror surface for a projection-type display.

Embodiment 3

Although in the manufacturing process of the first embodiment only the second interlayer insulating film 337 and the insulating layer 341 to be buried are planarized, in the invention the first interlayer insulating film 330 may also be planarized.

Where an interlayer insulating film has a multilayered structure, a planarization step may be executed after formation of each constituent layer.

In the invention, the flatness of the pixel electrode surfaces is improved by securing a sufficient degree of flatness before formation of pixel electrodes and then filling in the gaps between the pixel electrodes by buried insulating layers. Therefore, the fact that the number of planarization steps is large causes no problem and is, rather, preferable.

Embodiment 4

This embodiment is directed to a case where TFTs having a different structure shown in the first embodiment are used as semiconductor elements for active matrix driving. The TFTs having the structure of this embodiment can easily be applied to the second embodiment.

Figure 8:
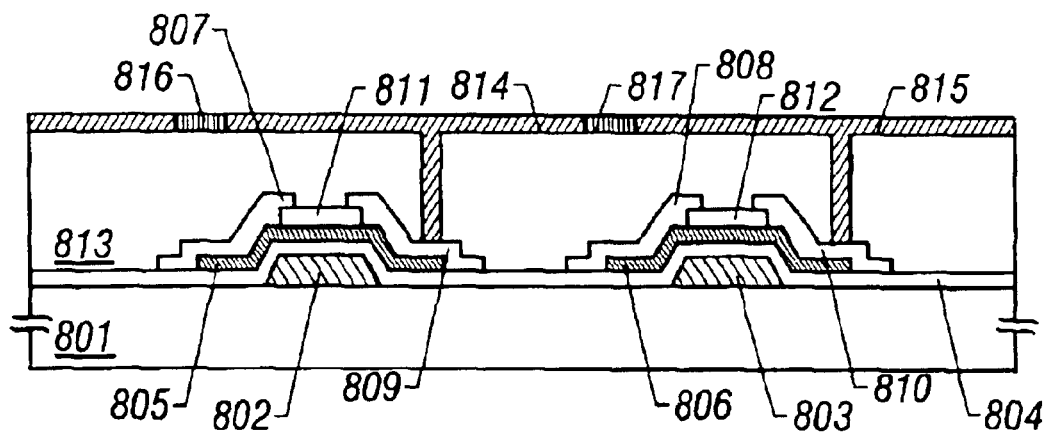
FIG. 8 shows a structure of an active matrix substrate according to a fourth embodiment of the invention.

Although the coplanar TFT, which is a typical example of the top-gate TFT, is used in the first embodiment, the bottom-gate TFT may be used. FIG. 8 shows a case where the inverted staggered structure TFT, which is a typical example of the bottom-gate TFT, is used.

In FIG. 8, reference numeral 801 denotes a glass substrate, numerals 802 and 803 denote gate electrodes, and numeral 804 denotes a gate insulating film. Active layers 805 and 806 are silicon films that are not intentionally doped with any impurity.

Reference numerals 807 and 808 denote source electrodes, numerals 809 and 810 denote drain electrodes, and 811 and 812 denote silicon nitride films as channel stoppers (or etching stoppers).

That is, the portions of the active layers 805 and 806 that are located under the channel stoppers 811 and 812 substantially serve as channel forming regions, respectively.

The basic structure of the inverted staggered structure TFT has been described above. In this embodiment, the inverted staggered structure TFTs are covered with an interlayer insulating film 813 composed of an organic resin film, planarization is performed, and then pixel electrodes 814 and 815 are formed. Naturally, the gaps between the pixel electrodes 814, 815, etc. are filled in by buried insulating layers 816 and 817 by utilizing the invention.

Next, a description will be made of a case where insulatedgate field-effect transistors (IGFETs) are formed as semiconductor elements of the invention. The IGFET, which is also called the MOSFET, is a transistor formed on a silicon wafer.

Figure 9:
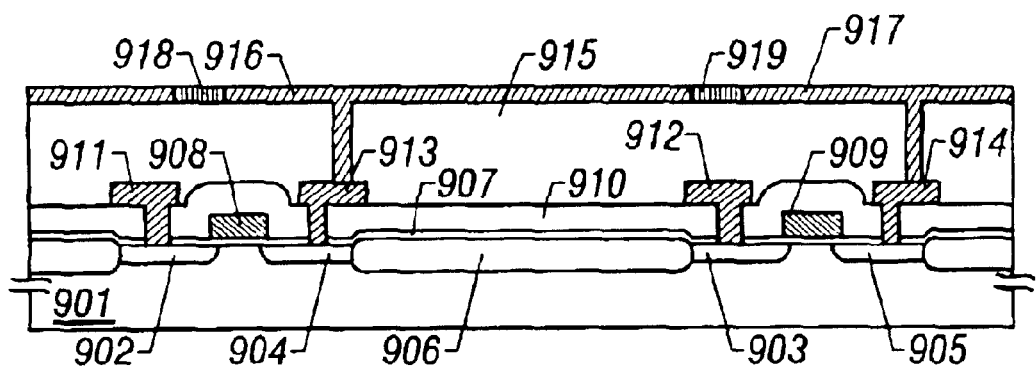
FIG. 9 shows another structure of an active matrix substrate according to the fourth embodiment.

In FIG. 9, reference numeral 901 denotes a semiconductor substrate, numerals 902 and 903 denote source regions, and numerals 904 and 905 denote drain regions. The source regions 902 and 903 and the drain regions 904 and 905 can be formed by adding impurity ions by ion implantation and then thermally diffusing those. A device isolation oxide layer 906 can be formed by an ordinary LOCOS technique.

Reference numeral 907 denotes a gate insulating film, numerals 908 and 909 denote gate electrodes, a numeral 910 denotes a first interlayer insulating film, numerals 911 and 912 denote source electrodes, and numerals 913 and 914 denote drain electrodes. A second interlayer insulating film 915 is formed, with planarization, on the above components. Pixel electrodes 918 and 989 are formed on the planarized surface of the second interlayer insulating film 915.

The gaps between the pixel electrodes 916, 917, etc. are filled in by buried insulating layers 918 and 919 by utilizing the invention.

In addition to the active matrix displays of this embodiment that use the IGFET or the top-gate or bottom-gate TFT, the first aspect of the invention can be applied to active matrix displays using the thin-film diode, the MIM element, the varistor element, or the like.

As described above in this embodiments, the first aspect of the invention can be applied to reflection-type LCDs and transmission-type LCDs using a semiconductor element of every structure.

In particular, in the case of the reflection-type LCD, the first aspect of the invention provides an advantage that the area of each pixel can be fully utilized by planarizing the structure above the semiconductor element and forming a pixel electrode thereon. The first aspect of the invention is effective in utilizing the that advantage more effectively. Therefore, a reflection-type LCD manufactured by utilizing the invention can be given high resolution and a large aperture ratio.

Embodiment 5

In this embodiment, an example process of manufacturing a reflection-type LCD by utilizing the second aspect of the invention will be described with reference to FIGS. 11A to 11D and 12A to 12C. Since the invention is directed to the technique relating to planarization of pixels, the TFT structure itself is not limited to that in this embodiment.

First, a substrate 1101 having an insulating surface is prepared. In this embodiment, a silicon oxide film as an undercoat film is formed on a glass substrate. Then, active layers 1102 to 1104 that are crystalline silicon films are formed on the substrate 1101. Although only three TFTs will be described in this embodiment, actually million or more TFTs are formed in a pixel matrix circuit.

In this embodiment, a crystalline silicon film is obtained by thermally crystallizing an amorphous silicon film. The crystalline silicon film is patterned into the active layers 1102 to 1104 by an ordinary photolithography method. In this embodiment, a catalyst element (nickel) for accelerating crystallization is added in the crystallization step. This technique is described in detail in Japanese Unexamined Patent Publication No. Hei. 7-130652.

Then, a 150-nm-thick silicon oxide film is formed as a gate insulating film 1105. An aluminum film (not shown) containing scandium at 0.2 wt % is formed thereon and patterned into island-like patterns as starting members of gate electrodes.

At this stage, in this embodiment, a technique disclosed in Japanese Unexamined Patent Publication No. Hei. 7-135318 is utilized. For details, refer to this publication.

First, anodization is performed in a 3%-aqueous solution of oxalic acid in a state that the resist mask that was used in the patterning is left on the island-like patterns. A platinum electrode is used as the cathode, the formation current is set at 2 to 3 mA, and the final voltage is set at 8 V. In this manner, porous anodic oxide films 1106 to 1108 are formed.

After the resist mask is removed, anodization is again performed in a solution obtained by neutralizing 3%-ethylene glycol solution of tartaric acid with aqueous ammonia. The formation current and the final voltage may be set at 5 to 6 mA and 100 V, respectively. Dense anodic oxide films 1109 to 1111 are thus formed.

Figure 11A:
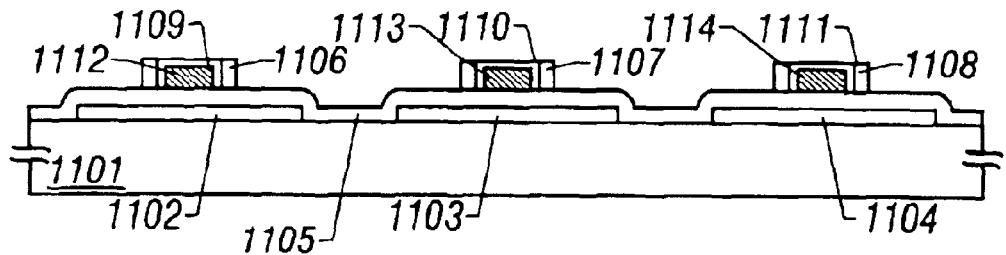
FIGS. 11A to 11D and 12A to 12C show a process of manufacturing a reflection type LCD according to a fifth embodiment of the invention.

Gate electrodes 1112 to 1114 are defined by the above step (see FIG. 11A). In the pixel matrix circuit, gate lines for connecting the gate electrodes are formed every other line at the same as the gate electrodes are.

Thereafter, the gate insulating film 1105 is etched by using the gate electrodes 1112 to 1114 as a mask by dry etching that uses a $CF^4$ gas. Gate insulating films 1115 to 1117 are thus formed so as to have shapes shown in FIG. 11B.

In this state, impurity ions for imparting one conductivity type are added by ion implantation or plasma doping. P (phosphorus) ions may be added if the pixel matrix circuit is to be constituted of n-type TFTs and B (boron) ions may added if it is to be constituted of p-type TFTs.

The above ion addition step is performed in two steps. In the first step, the acceleration voltage is set as high as about 80 kV so that a peak of an impurity ion profile is located at the portions under the end portions (projected portions) of the gate insulating films 1115 to 1117. In the second step, the acceleration voltage is set as low as about 5 kV so that impurity ions are not added to the portions under the end portions of the gate insulating films 1115 to 1117.

Figure 11B:
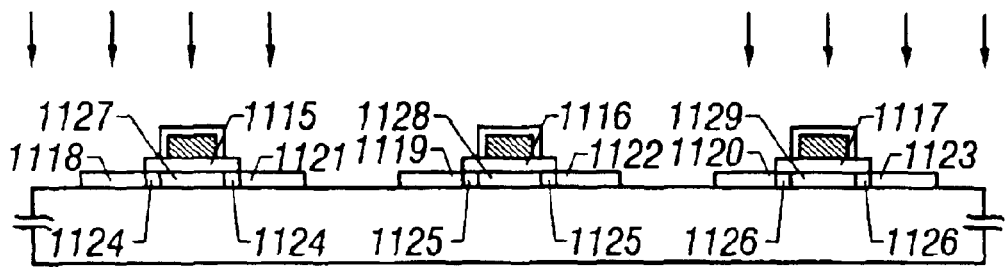

As a result, source regions 1118 to 1120, drain regions 1121 to 1123, low-concentration impurity regions (LDD regions) 1124 to 1126, and channel forming regions 1127 to 1129 of TFTs are formed (see FIG. 11B).

It is preferred that impurity ions be added to the source regions 1118 to 1120 and the drain regions 1121 to 1123 so that a sheet resistance of 300 to 500 $\Omega/\square$ is obtained there. It is necessary to optimize the impurity concentration of the low-concentration impurity regions 1124 to 1126 in accordance with the performance of the TFTs needed. After completion of the impurity ions addition step, a heat treatment is performed to activate the impurity ions.

Figure 11C:
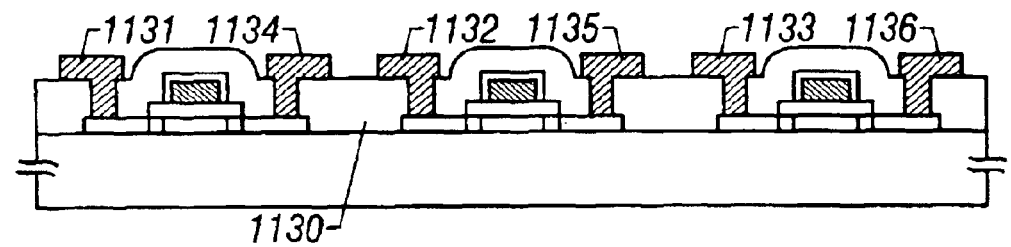
Figure 11D:
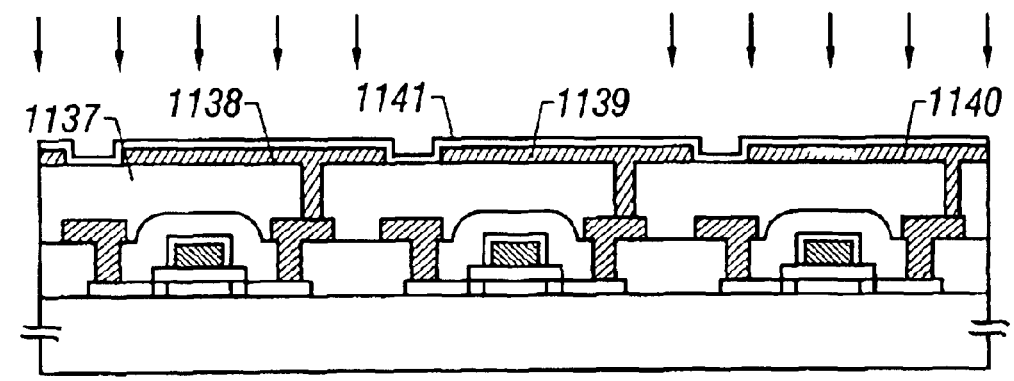

Then, a 400-nm-thick silicon oxide film is formed as a first interlayer insulating film 1130, and source electrodes 1131 to 1133 and drain electrodes 1134 to 1136 are formed therethrough (see FIG. 11C).

Thereafter, a silicon oxide film of 0.5 to 1 $\mu$m is formed as a second interlayer insulating film 1137. The second interlayer insulting film 1137 may be an organic resin film. Examples of materials of the organic resin film are polyimide, polyamide, polyimideamide, acrylic and the like.

After the formation of the second interlayer insulating film 1137, a 100-nm-thick aluminum film containing titanium at 1 wt % is formed and then patterned into pixel electrodes 1138 to 1140. Naturally other metal materials may be used.

Then, a DLC film 1141 is formed so as to cover the pixel electrodes 1138 to 1140 by a vapor-phase method such as plasma CVD, ECR plasma CVD, sputtering, ion beam sputtering, or ionized evaporation.

Hydrocarbon is used as the material gas for forming the DLC film 1141. Examples of usable hydrocarbons are saturated hydrocarbons such as methane, ethane, and propane and unsaturated hydrocarbons such as ethylene and acetylene. There may also be used halogenated hydrocarbon in which one or a plurality of hydrogen atoms of a hydrocarbon molecule are replaced by halogen elements.

It is effective to add hydrogen to a hydrocarbon gas. Since the addition of hydrogen increases hydrogen radicals in plasma, an effect of removing excess hydrogen atoms from the film and thereby improving the film quality is expected. It is preferable that the ratio of the flow rate of the hydrogen gas to that of the entire gas be 30 to 90% (50 to 70% is even preferable). The film forming rate decreases if this ratio is too large, and the effect of removing excess hydrogen atoms is not obtained if it is too small.

Helium may be added as a carrier gas for diluting the material gas. In the case of sputtering, argon may be added as a sputtering gas. As disclosed in Japanese Unexamined Patent Publication No. Hei. 6-208721, it is effective to add an element of groups 13 to 15.

The reaction pressure may be set at 5 to 1,000 mTorr, preferably 10 to 100 mTorr. The frequency of RF power is set at 13.56 MHz, which is usually employed, and the RF power is set at 0.01 to 1 W/cm$^2$, preferably 0.05 to 0.5 W/cm$^2$. It is effective to add an excitation effect of microwaves of 2.45 GHz to accelerate decomposition of the material gas. It is also effective to utilize electron spin resonance by forming a magnetic field of 875 Gauss in the microwave excitation space.

In this embodiment, a methane gas as a material gas and a hydrogen gas are introduced into the reaction space of a plasma CVD apparatus both at 50 sccm, and the film forming pressure is set at 10 mTorr. The RF power is set at 100 W and the temperature of the reaction space is set at the room temperature. Further, to increase the density and the hardness of a resulting DLC film, a DC bias voltage of 200 V is applied to the substrate to form an electric field that causes particles (ions) in the plasma to impinge on the film forming surface.

According to experiments of the inventors, forming a DLC film as thin as 10 nm can reduce the surface friction coefficient (center line average roughness Ra) to 0.2 to 0.4, which is smaller than a practical friction coefficient 0.4. Further, almost no variation occurs in friction coefficient even if sliding action on the surface is repeated, which means that a DLC film as thin as 10 nm can sufficiently serve as a stopper in a CMP step.

The friction coefficient depends on the thickness of the DLC film; it decreases as the thickness increases. From this viewpoint, the thickness of the DLC film 1141 may be 10 nm or more. However, if the DLC film 1141 is too thick, the electric field applied to the liquid crystal becomes unduly weak. Therefore, the appropriate thickness range of the DLC film 1141 is about 10 to 50 nm.

In the case of the reflection-type LCD, a reflection enhancement treatment which increases the reflectance by forming a dielectric on the surface of the pixel electrodes is available. This utilizes the phenomenon that in general the reflectance of the pixel electrodes varies depending on the thickness of the dielectric. The optimum thickness of the dielectric correlates with the wavelength of incident light. Therefore, in this embodiment, the reflectance can be increased by optimizing the thickness of the DLC film 1141 in accordance with incident light.

For details of the film forming method, the film forming apparatus, etc., reference is made to Japanese Examined Patent Publication Nos. Hei. 3-72711, Hei. 4-27690, and Hei. 4-27691 of the present inventors.

After the DLC film 1141 is formed in the above manner, an insulating layer 1142 for filling in the boundary portions (gaps) between the pixel electrodes 1138 to 1140. Where the pixel electrodes are formed in such a manner that the boundary portions are located above the source lines 1131 to 1133 as in the case of this embodiment, the source lines 1131 to 1133 serve as a black mask. Therefore, the insulating layer 1142 may be transparent.

However, to secure the light interrupting function more reliably, it is desirable that a light interruptive insulating film such as an organic resin film in which a black pigment or carbon is dispersed (a solution-application-type silicon oxide film such as PSG) be used as the insulating layer 1142. With this measure, the light interrupting function can be attained reliably even in a case where the source lines 1131 to 1133 are narrow or incident light comes obliquely.

By making the relative dielectric constant of the material of the insulating layer 1142 than that of a liquid crystal used by as large a margin as possible, lateral electric fields developing between the pixel electrodes 1138 to 1140 can be reduced.

Figure 12A:
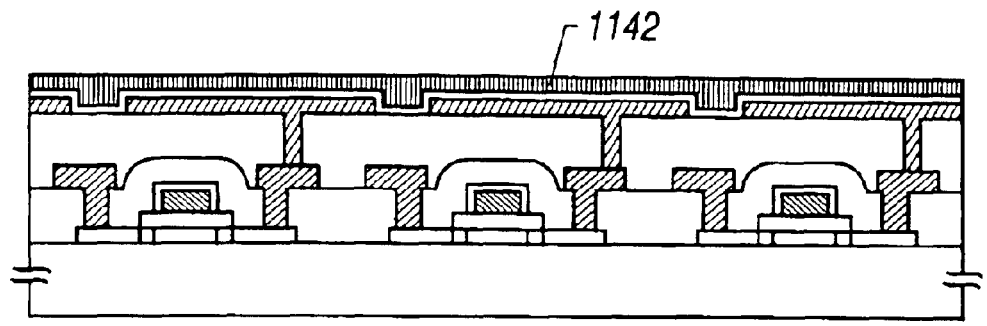

The state of FIG. 12A is thus obtained. In this state, a CMP step for planarizing the insulating layer 1142 is executed whereby buried insulating layers 1143 to 1145 are formed so as to be buried in the gaps between the pixel electrodes 1138 to 1140 (see FIG. 12B).

Since the surfaces of the pixel electrodes 1138 to 1140 are approximately flush with the surfaces of the buried insulating layers 1143 to 1145, a superior flat surface can be obtained. Further, since the surfaces of the pixel electrodes 1138 to 1140 are protected by the DLC film 1141, excessive polishing can be prevented.

Figure 12B:
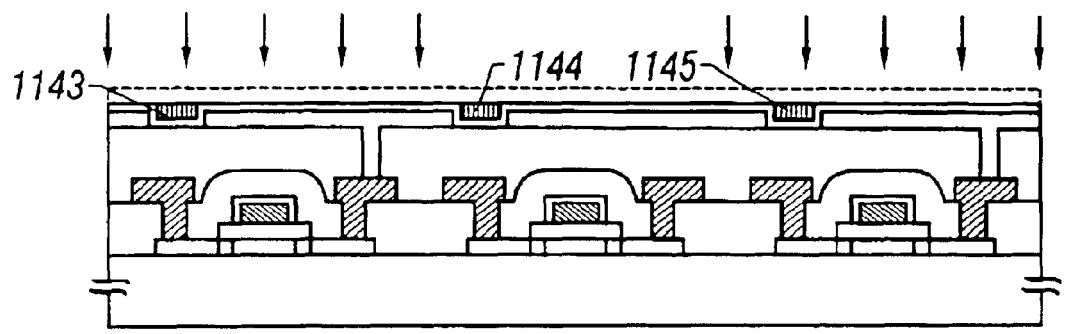
Figure 14:
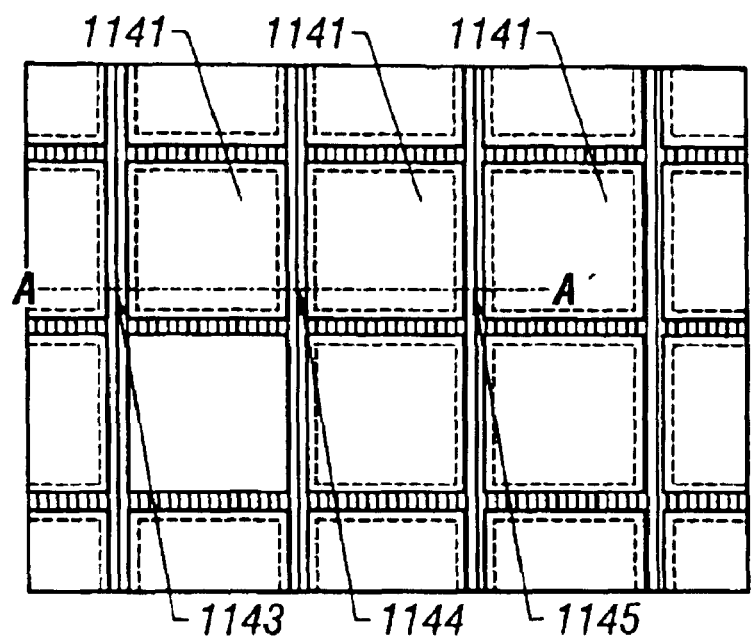
FIG. 14 is a top view of a pixel matrix circuit according to the fifth embodiment.

FIG. 14 is a simplified top view of the pixel matrix circuit in this state. FIG. 12B is a sectional view taken along line A–A' in FIG. 14.

The reference numerals used in FIG. 14 are the same as in FIGS. 12A and 12B.

As shown in FIG. 14, the pixel electrodes 1138 to 1140 etc. are arranged in matrix form and their surfaces are covered with the DLC film 1141. The gaps between the pixel electrodes 1138 to 1140 etc. are buried by the buried insulating layers 1143 to 1145 etc.

Therefore, although the buried insulating layers 1143 to 1145 are denoted by separate reference numerals, they are integral with each other and have a grid-like shape.

The pixel matrix circuit is completed in the above manner.

Actually, driver circuits for driving the pixel TFTs and other circuits are also formed on the same substrate at the same time. This type of substrate is usually called a TFT-side substrate or an active matrix substrate. In this specification, this substrate is called a first substrate.

Figure 12C:
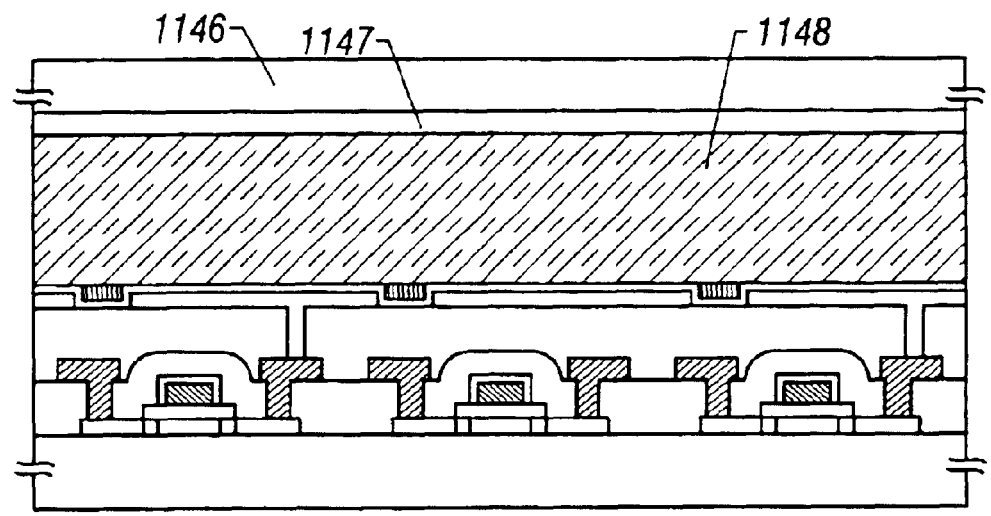

After the completion of the first substrate, an opposed substrate (called a second substrate in this specification) in which an opposed electrode 1147 is formed on a transparent substrate 1146 is bonded to the first substrate and a liquid crystal layer 1148 is held between the first and second substrates. A reflection-type LCD is thus completed as shown in FIG. 12C.

The above cell assembling may be performed according to a known method. It is possible to disperse a dichroic dye in the liquid crystal layer 1148 or provide color filters on the opposed substrate. The kind of liquid crystal layer 1148, the use of color filters, and other factors may be determined properly by a party who practices the invention because they depend on the mode of driving the liquid crystal.

Embodiment 6

In this embodiment, an example process of manufacturing a pixel matrix circuit of a transmission-type LCD by utilizing the second aspect of the invention will be described with reference to FIGS. 13A to 13C. Since the manufacturing process of this embodiment is the same as that of the fifth embodiment to a certain intermediate step, only different points between the two processes will be described below.

Figure 13A:
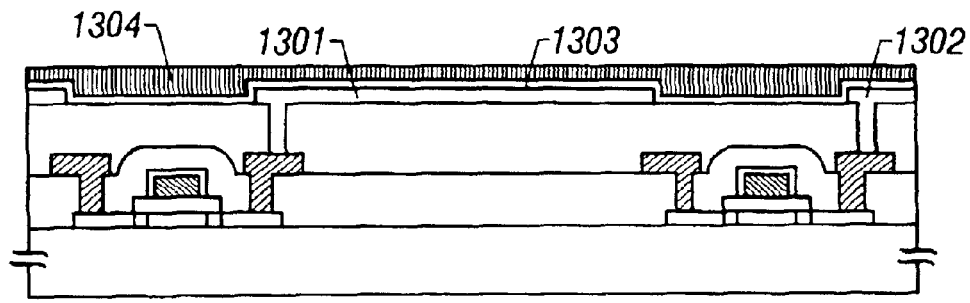
FIGS. 13A to 13C show a process of manufacturing a transmission-type LCD according to a sixth embodiment of the invention.
Figure 13B:
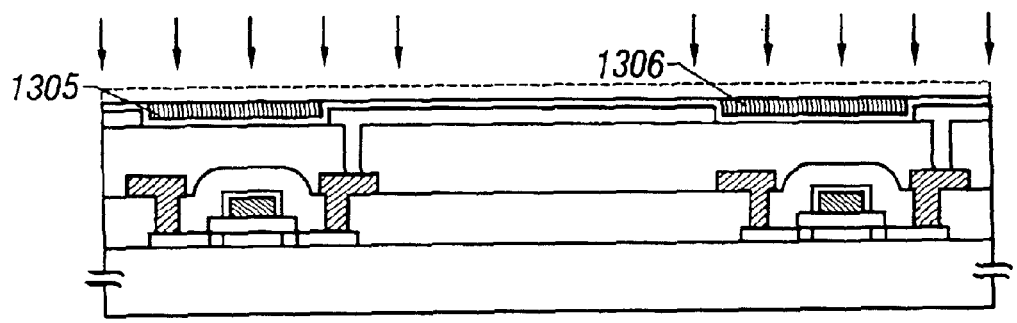
Figure 13C:
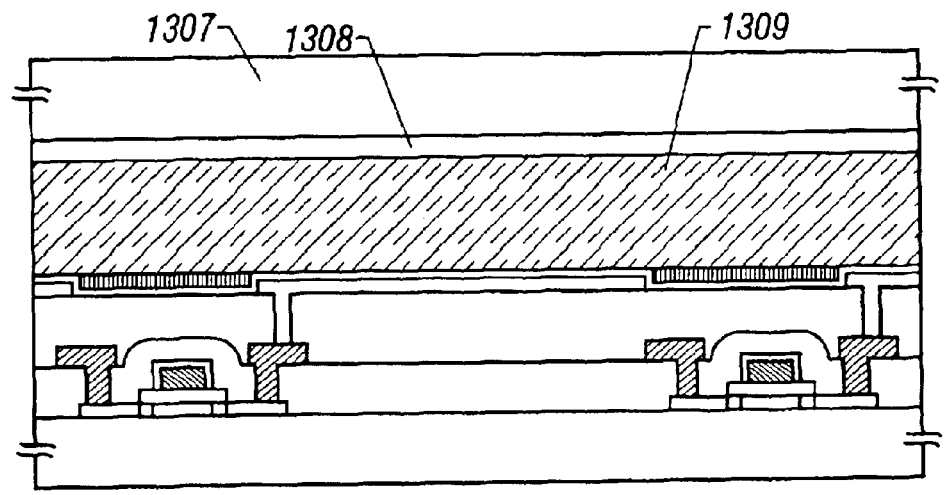

FIG. 13A shows a state that pixel electrodes 1301 and 1302, a DLC film 1303, and an insulating layer 1304 to be buried have been formed by the same steps as in the fifth embodiment. In this embodiment, the pixel electrodes 1301 and 1302 are transparent conductive films (made of ITO, $SnO_2$, or the like). The pixel electrodes 1301 and 1302 are formed so as not to overlap with the TFTs.

In this embodiment, for example, polyimide in which a black pigment is dispersed is used as the insulating layer 1304. Since the active layers of the TFTs also need to be shielded from light in the case of the transmission type, it is preferred to use a light interruptive insulating film as the insulating layer 1304.

Subsequently, a CMP step is executed whereby buried insulating layers 1305 and 1306 are formed so as to be flush with the pixel electrodes 1301 and 1302 (more correctly, with the DLC film 1303; see FIG. 13B).

Figure 15:
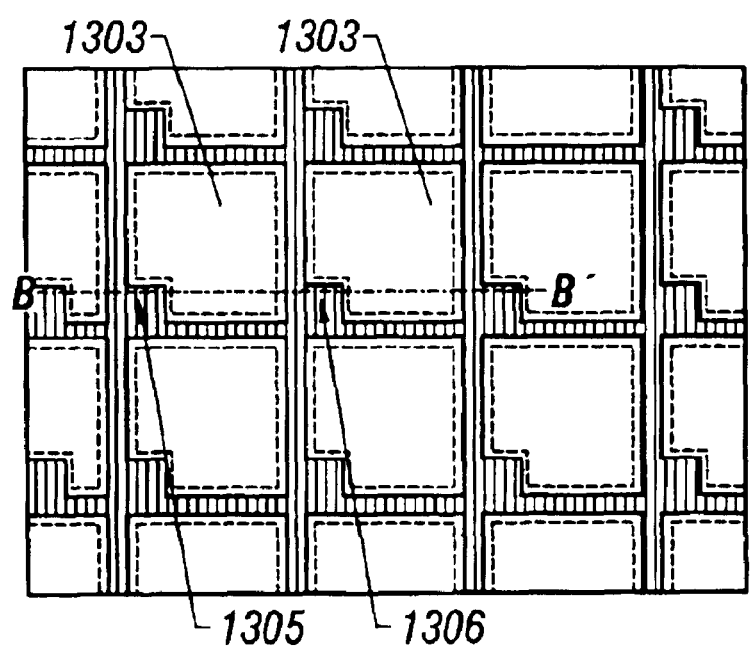
FIG. 15 is a top view of a pixel matrix circuit according to the sixth embodiment.

FIG. 15 is a simplified top view of the pixel matrix circuit in this state. FIG. 13B is a sectional view taken along line B–B' in FIG. 15. The reference numerals used in FIG. 15 are the same as in FIGS. 13A and 13B.

As shown in FIG. 15, the pixel electrodes 1301, 1302, etc. are arranged in matrix form and their surfaces are covered with the DLC film 1303. The gaps between the pixel electrodes 1301, 1302, etc. are filled in by the integral buried insulating layers 1305, 1306, etc. In this embodiment, the buried insulating layers 1305, 1306 also formed over the TFTs provide an advantage of preventing a resistance variation that would otherwise be caused by light incident on the active layers.

A TFT-side substrate is completed in the above manner. After the completion of the TFT-side substrate, an ordinary cell assembling step is executed whereby a liquid crystal layer 1309 is held between the TFT-side substrate and an opposed substrate that is composed of a transparent substrate 1307 and an opposed electrode 1308. A transmission-type LCD is thus completed as shown in FIG. 13C.

Embodiment 7

In the fifth embodiment, it is effective to planarize the pixel electrodes 1138 to 1140 before the formation of the DLC film 1141. It is preferable that this planarization step be a CMP step.

In the second aspect of the invention, since the DLC film is used as a stopper film in the mechanical polishing step, the surface state of the DLC film reflects the surface state itself of the pixel electrodes. Therefore, where the surfaces of the pixel electrodes are required to be highly flat as in the case of the reflection-type LCD, the surfaces of the pixel electrodes should be made highly flat in advance.

Embodiment 8

This embodiment is directed to a case where TFTs having a different structure than in the fifth embodiment are used as semiconductor elements for active matrix driving. The TFTs having the structure of this embodiment can easily be applied to the sixth embodiment.

Figure 16:
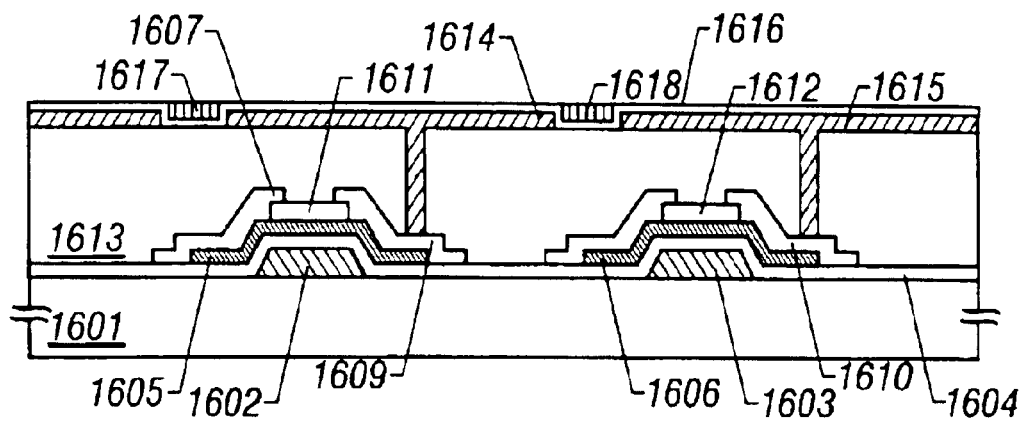
FIG. 16 shows a structure of an active matrix substrate according to an eighth embodiment of the invention.

Although the coplanar TFT, which is a typical example of the top-gate TFT, is used in the fifth embodiment, the bottom-gate TFT may be used. FIG. 16 shows a case where the inverted staggered structure TFT, which is a typical example of the bottom-gate TFT, is used.

In FIG. 16, reference numeral 1601 denotes a glass substrate, numerals 1602 and 1603 denote gate electrodes, and numeral 1604 denotes a gate insulating film. Active layers 1605 and 1606 are silicon films that are intentionally not doped with any impurity.

Reference numerals 1607 and 1608 denote source electrodes, numerals 1609 and 1610 denote drain electrodes, and 1611 and 1612 denote silicon nitride films as channel stoppers (or etching stoppers). That is, the portions of the active layers 1605 and 1606 that are located under the channel stoppers 1611 and 1612 substantially serve as channel forming regions, respectively.

The basic structure of the inverted staggered structure TFT has been described above. In this embodiment, the inverted staggered structure TFTs are covered with an interlayer insulating film 1613 composed of an organic resin film, planarization is performed, and then pixel electrodes 1614 and 1615 are formed. In a state that the pixel electrodes 1614 and 1615 are protected by the DLC film 1616, an insulating layer to be buried is formed and then planarized by a CMP step. The gaps between the pixel electrodes 1614, 1615, etc. are filled in by buried insulating layers 1617 and 1618.

Next, a description will be made of a case where insulated-gate field-effect transistors (IGFETs) are formed as semiconductor elements of the invention. The IGFET, which is also called the MOSFET, is a transistor formed on a silicon wafer.

Figure 17:
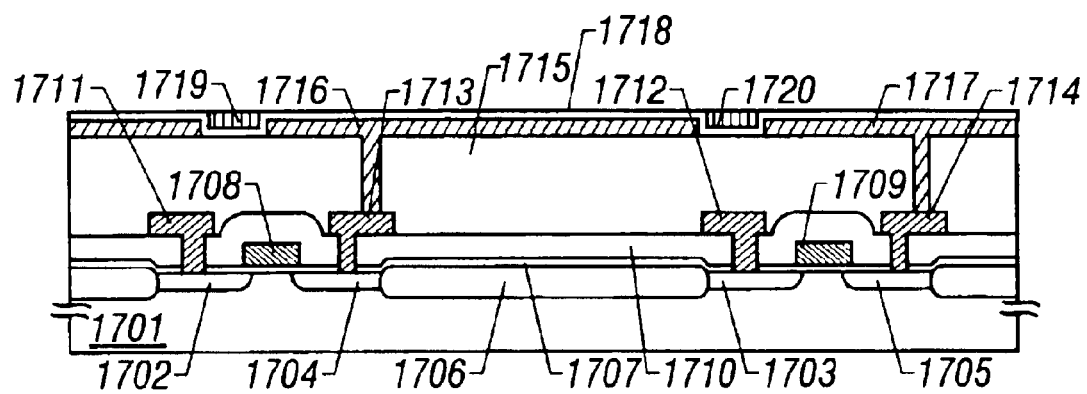
FIG. 17 shows another structure of an active matrix substrate according to eighth embodiment.
Figure 18:
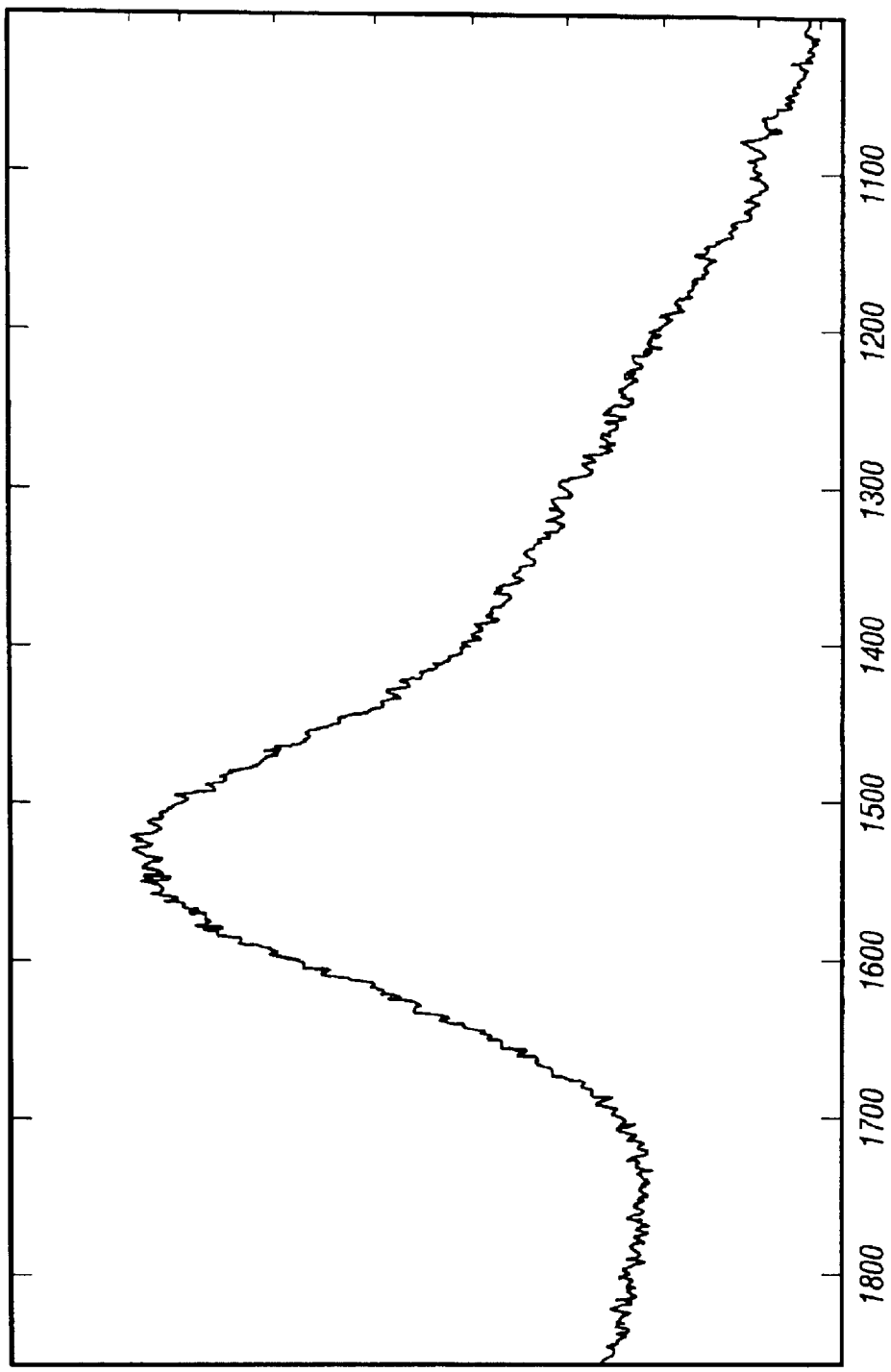
FIG. 18 shows Raman data of a DLC film.

In FIG. 17, reference numeral 1701 denotes a semiconductor substrate, numerals 1702 and 1703 denote source regions, and numerals 1704 and 1705 denote drain regions. The source regions 1702 and 1703 and the drain regions 1704 and 1705 can be formed by adding impurity ions by ion implantation and then thermally diffusing those. A device isolation oxide layer 1706 can be formed by an ordinary LOCOS technique.

Reference numeral 1707 denotes a gate insulating film, numerals 1708 and 1709 denote gate electrodes, a numeral 1710 denotes a first interlayer insulating film, numerals 1711 and 1712 denote source electrodes, and numerals 1713 and 1714 denote drain electrodes. A second interlayer insulating film 1715 is formed on the above components and pixel electrodes 1716 and 1717 are formed on the second interlayer insulating film 1715. Also in this case, the pixel electrodes 1716 and 1717 are protected by the DLC film 1718 and the boundary portions are filled in by buried insulating layers 1719 and 1720.

In addition to the active matrix displays of this embodiment that use the IGFET or the top-gate or bottom-gate TFT, the second aspect of the invention can be applied to active matrix displays using the thin-film diode, the MIM element, the varistor element, or the like.

As described above in this embodiments, the second aspect of the invention can be applied to reflection-type LCDs and transmission-type LCDs using a semiconductor element of every structure.

In particular, in the case of the reflection-type LCD, the second aspect of the invention provides an advantage that the area of each pixel can be fully utilized by planarizing the structure above the semiconductor element and forming a pixel electrode thereon. The second aspect of the invention is effective in utilizing such advantage more effectively. Therefore, a reflection-type LCD manufactured by utilizing the second aspect of the invention can be given high resolution and a large aperture ratio.

Embodiment 9

In the fifth embodiment, it is effective to planarize the second interlayer insulating film 1137 before forming the pixel electrodes 1138 to 1140.

There are various methods suitable for planarizing an interlayer insulating film, such as a method of forming an inter layer insulating film thicker than a necessary thickness, a leveling method using an organic resin film, a mechanical polishing method, and a method using am etch back technique. Among those methods, the mechanical polishing method is most effective in obtaining a superior flat surface.

A typical example of the mechanical polishing method is a CMP (chemical mechanical polishing) technique. The CMP technique is a polishing technique that is a combination of chemical etching with a liquid chemical and mechanical polishing with an abrasive.

According to this embodiment, since the pixel electrodes 1138 to 1140 are formed on a superior flat surface, they are given a high reflectance. Therefore, this embodiment is very effective when applied to projection-type displays or like uses.

Embodiment 10

The invention can also be applied to a passive matrix liquid crystal display device. In this case, striped electrodes are formed on each of two substrates, the two substrates are bonded together so that the striped electrodes are rendered perpendicular to each other, and a liquid crystal layer is held between the two substrates.

In this case, if one substrate is transparent, the other may be either transparent or light interruptive. However, the striped electrodes formed on the transparent substrate should be transparent conductive films.

In this embodiment, striped electrodes made only or mainly of aluminum are formed on the substrate that is opposed to the transparent substrate and the gaps between the striped electrodes are filled in by insulating layers.

Where the invention is applied to a passive matrix LCD, an advantage of a reduction in crosstalk between adjacent electrodes can be obtained by forming the insulating layers by using a material (for instance, an organic resin material) having a smaller relative dielectric constant than the liquid crystal layer.

Embodiment 11

Reflection-type LCDs manufactured by utilizing the invention may employ various kinds of liquid crystal display modes such as the ECB (electric-field-controlled birefringence) mode, the PCGH (phase change guest-host) mode, the OCB mode, the HAN mode, and the PDLC-type guest-host mode.

The ECB mode is a display mode in which the liquid crystal alignment is varied by changing the voltage applied to the liquid crystal layer and a resulting variation in birefringence of the liquid crystal layer is detected by a pair of polarizing plates. Color display is performed in this mode. This mode enables a scheme that does not use color filters, in which case bright display is possible.

The PCGH mode is a display mode in which a dichroic dye as guest molecules is mixed into a host liquid crystal and the light absorption coefficient of the liquid crystal layer is varied by changing the alignment state of liquid crystal molecules by the voltage applied to the liquid crystal layer. This mode enables a scheme that uses no polarizing plates, in which case high contrast can be obtained.

The PDLC mode is a display mode which uses a polymer dispersion liquid crystal in which a polymer is dispersed in a liquid crystal (or vice versa). Because no polarizing plates are needed, this mode enables bright display. Further, by using a solid-state polymer dispersion liquid crystal, a configuration without a glass substrate on the opposing side can be realized.

In each of the above-mentioned various kinds of display modes, whether to use polarizing plates or color filters can be determined freely in accordance with the features of the display mode. For example, in the case of the PCGH mode, bright display can be attained even by a single plate configuration using color filters because no polarizing plates are needed.

Embodiment 12

This embodiment is directed to examples of electro-optical devices in which the invention is applied to a display device. First, a three-plate projector using reflection-type LCDs according to the first or fifth embodiment will be described with reference to FIG. 19A.

Figure 19A:
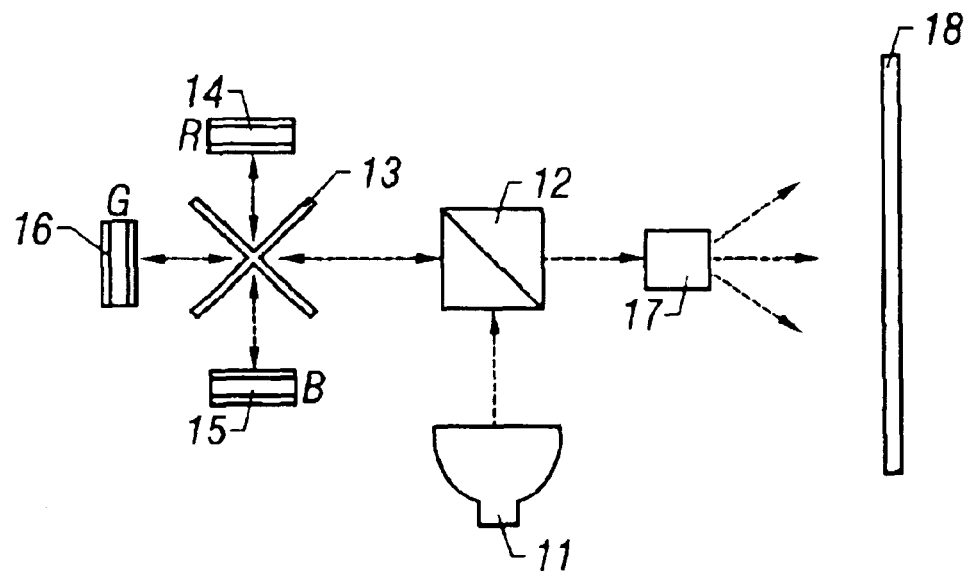
FIGS. 19A and 19B show configurations of projectors according to a twelfth embodiment of the invention.

As shown in FIG. 19A, light including R (red), B (blue), and G (green) components that is output from a light source 11 such as a metal halide lamp or a halogen lamp is reflected by a polarizing beam splitter 12 so as to proceed to a crossed dichroic mirror 13.

The polarizing beam splitter is an optical filter having a function of reflecting or transmitting light depending on its polarization direction. In this embodiment, the light emitted from the light source 11 is given such polarization that the light is reflected by the polarizing beam splitter 12.

The crossed dichroic mirror 13 reflects the R-component light and the B-component light toward an R liquid crystal panel 14 and a B liquid crystal panel 15, respectively. The G-component light passes through the crossed dichroic mirror 13 and enters a G liquid crystal panel 16.

In each of the liquid crystal panels 14 to 16, liquid crystal molecules are aligned so that the liquid crystal panel reflects incident light without changing its polarization direction if a pixel is in an off state. If a pixel is in an on state, the alignment direction of liquid crystal molecules is changed and accordingly incident light is subjected to a change in polarization direction.

After being reflected by the respective liquid crystal panels 14 to 16, the component beams are combined together in again being reflected by (R and B) or passing through (G) the crossed dichroic mirror 13. The combined light again enters the polarizing beam splitter 12.

At this time, light that was reflected by an on-state pixel region was changed in polarization direction and hence passes through the polarizing beam splitter 12. On the other hand, light that was reflected by an off-state pixel region was not changed in polarization direction and hence is reflected by the polarizing beam splitter 12.

As described above, by on/off-controlling pixel regions that are arranged in matrix form in the pixel matrix circuit with a number of semiconductor elements, only light beams that are reflected by particular pixel regions are allowed to pass through the polarizing beam splitter 12. This operation is common to the liquid crystal panels 14 to 16.

The light containing image information that has passed through the polarizing beam splitter 12 in the above manner is enlarged and projected onto a screen 18 by an optical lens 17 such as a projection lens.

Since the gaps between the pixel electrodes are filled in, a reflection-type LCD according to the invention is given high resolution and a high aperture ratio. Where the pixel electrodes are further subjected to planarization, the reflection-type LCD has a high reflectance. Therefore, the reflection type LCD can attain superior display performance even when used in electro-optical devices that projects an image in an enlarged manner as in the case of the projector shown in FIG. 19A.

Next, with reference to FIG. 19B, a description will be made of a three-plate projector which uses transmission-type LCDs according to the second or sixth embodiment.

Figure 19B:
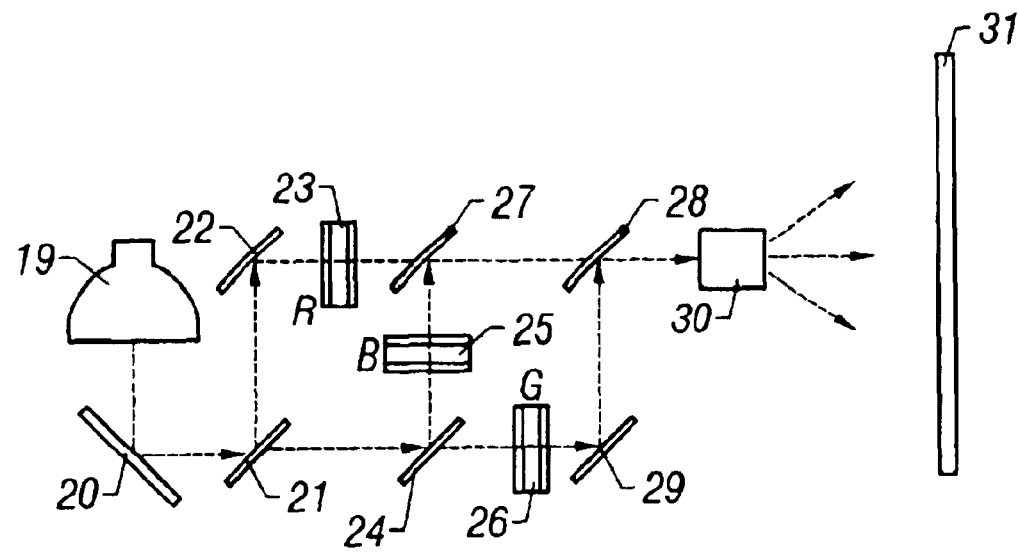

In FIG. 19B, reference numerals 19 and 20 denote a light source such as a halogen lamp and a reflector, respectively. Light containing R, G, and B components enters a dichroic mirror 21 and only the R-component light is reflected by the same. The R-component light is then reflected by a reflector 22 and enters an R liquid crystal panel 23.

Light that has passed through the dichroic mirror 21 enters a dichroic mirror 24 and only B-component light is reflected by the same. The B-component light then enters a B liquid crystal panel 25. G-component light that has passed through the dichroic mirror 24 enters a G liquid crystal panel 26.

The R-component light is combined with the B-component light by a dichroic mirror 27 and resulting light enters a dichroic mirror 28. The G-component light is reflected by a reflector 29 and enters a dichroic mirror 28, where all the R, G, and B component beams are combined together. Resulting light is enlarged and projected onto a screen 31 by a projection lens 30.

Having high resolution and a high aperture ratio, the transmission-type LCD according to the invention can realize electro-optical devices having superior display performance. In particular, the high aperture ratio is the most significant advantage of the transmission-type LCD according to the invention.

Embodiment 13

In this embodiment, application projects (electro-optical devices) to which a liquid crystal display device of the invention can be applied will be described with reference to FIGS. 20A to 20F.

Examples of electro-optical devices utilizing the invention are a video camera, a still camera, a projector, a head-mounted display, a car navigation apparatus, a personal computer, and a portable information terminal (a mobile computer, a cellular telephone, etc.).

FIG. 20A shows a mobile computer, which consists of a main body 2001, a camera section 2002, an image receiving section 2003, a manipulation switch 2004, and a display device 2005. The mobile computer can further be miniaturized and reduced in power consumption by using a reflection-type LCD of the invention in the display device 2005.

FIG. 20B shows a head-mounted display, which consists of a main body 2101, display devices 2102, and a band section 2103. The head-mounted display can greatly be miniaturized by using a reflection-type LCD of the invention in the display devices 2102.

FIG. 20C shows a front projector, which consists of a main body 2201, a light source 2202, a display device 2203, am optical system 2204, and a screen 2205. A high-resolution image can be realized by using a transmission-type LCD of the invention in the display device 2203.

FIG. 20D shows a cellular telephone, which consists of a main body 2301, a voice output section 2302, a voice input section 2303, a display device 2304, manipulation switches 2305, and an antenna 2306. By applying the invention to the display device 2304, the cellular telephone can be mounted with a display monitor that is superior in visibility.

FIG. 20E shows a video camera, which consists of a main body 2401, a display device 2402, a sound input section 2403, manipulation switches 2404, a battery 2405, and an image receiving section 2406. By applying the invention to the display device 2402, superior display performance that enables outdoor photographing well can be obtained.

FIG. 20F shows a rear projector, which consists of a main body 2501, a light source 2502, a display device 2503, a polarizing beam splitter 2504, reflectors 2505 and 2506, and a screen 2507. The rear projector can be thinned and a high-resolution image can be realized by using a reflection-type LCD of the invention in the display device 2503.

In the case of the direct-view displays (see FIGS. 20A, 20B, 20D, and 20E), it is effective to form asperities on the pixel electrode surfaces because the asperities enhance the light scattering effect and thereby increase the view field angle and improve the visibility. In the case of the projection-type displays (see FIGS. 20C and 20F), it is preferred that the pixel electrode surfaces be mirror surfaces. This reduces diffused reflection of light, thereby preventing a color deviation or a reduction in resolution.

As described above, the application range of the invention is extremely wide and the invention can be applied to display media of every field. Where a liquid crystal display device is used in projection-type display devices such as a projector, it is required to have high resolution. The invention is particularly effective for such a case.

Portable information terminal equipment (personal digital assistants) that is typified by a mobile computer, a portable telephone, and a video camera is desired to be compact and low in power consumption. A reflection-type LCD that does not require a backlight is effective for such a case.

In a liquid crystal display device utilizing the invention, the gaps between the pixel electrodes that are arranged in matrix form are filled in by buried insulating layers. As a result, the surfaces of the pixel electrodes are approximately flush with those of the buried insulating layers; that is, the step portions at the gaps between the pixel electrodes are planarized almost completely.

Therefore, the problems resulting from the step portions, such as alignment failures of a liquid crystal material and a contrast reduction due to diffused reflection of incident light, can be solved. Since the interlayer insulating film as an undercoat of the pixel electrodes is planarized in advance, the pixel electrodes are rendered completely flat.

As a result, a liquid crystal display device having a high aperture ratio and a high reflectance and exhibiting high-resolution display performance can be realized.

The buried insulating layers are obtained by planarizing an insulating layer that has been formed so as to be thicker than a necessary thickness. In particular, where the insulating layer is planarized by a mechanical polishing step (CMP step), excessive polishing of the pixel electrodes can be prevented by forming a DLC film between the pixel electrodes and the insulting film.

That is, since the CMP step is substantially finished at the time point when the DLC film is exposed, the control of the processing time can greatly be simplified. This is very effective in increasing the production yield.

What is claimed is:

1. A method of manufacturing a semiconductor device comprising the steps of:

planarizing an insulating film formed over a substrate having an insulating surface;

forming electrodes on the insulating film;

forming an insulating layer so as to cover the electrodes; and planarizing surfaces of the electrodes and a surface of the insulating layer so that they become flush with each other, thereby filling boundary portions between the electrodes with the insulating layer, with the insulating layer covering at least a channel forming region of a semiconductor element in the semiconductor device.

2. The method according to claim 1, wherein mechanical polishing is performed in each of the planarizing steps.

3. The method according to claim 1, wherein the insulating layer is light interruptive.

4. The method according to claim 1, wherein the insulating layer is an organic resin film in which at least one of a black pigment and a carbon-type material is dispersed.

5. A method of manufacturing a semiconductor device comprising the steps of:

planarizing an insulating film formed over a first substrate;

forming striped electrodes on the insulating film;

forming an insulating layer so as to cover the striped electrodes;

planarizing surfaces of the striped electrodes and a surface of the insulating layer so that they become flush with each other, thereby filling boundary portions between the striped electrodes with the insulating layer, with the insulating layer covering at least a channel forming region of a semiconductor element in the semiconductor device; and forming a liquid crystal layer between the first substrate and a second transparent substrate.

6. The method according to claim 5, wherein mechanical polishing is performed in each of the planarizing steps.

7. The method according to claim 5, wherein the insulating layer is light interruptive.

8. The method according to claim 5, wherein the insulating layer is an organic resin film in which at least one of a black pigment and a carbon-type material is dispersed.

9. A method of manufacturing a semiconductor device comprising the steps of:

forming semiconductor elements over a substrate having an insulating surface;

forming an interlayer insulating film over the semiconductor elements;

planarizing the interlayer insulating film;

forming pixel electrodes that are electrically connected to the respective semiconductor elements on the interlayer insulating film;

forming an insulating layer so as to cover the pixel electrodes; and planarizing surfaces of the pixel electrodes and a surface of the insulating layer so that they become flush with each other, thereby filling boundary portions between the pixel electrodes with the insulating layer, with the insulating layer covering at least channel forming regions of said semiconductor elements.

10. The method according to claim 9, wherein mechanical polishing is performed in each of the planarizing steps.

11. The method according to claim 9, wherein the insulating layer is light interruptive.

12. The method according to claim 9, wherein the insulating layer is an organic resin film in which at least one of a black pigment and a carbon-type material is dispersed.

13. The method according to claim 9, wherein the semiconductor elements are thin-film transistors.

14. A method of manufacturing a semiconductor device comprising the steps of:

forming semiconductor elements arranged in matrix form over a first substrate;

forming an interlayer insulating film over the semiconductor elements;

planarizing the interlayer insulating film;

forming pixel electrodes that are electrically connected to the respective semiconductor elements on the interlayer insulating film;

forming an insulating layer so as to cover the pixel electrodes;

planarizing surfaces of the pixel electrodes and a surface of the insulating layer so that they become flush with each other, thereby filling boundary portions between the pixel electrodes with the insulating layer, with the insulating layer covering at least channel forming regions of said semiconductor elements; and forming a liquid crystal layer between the first substrate and a second transparent substrate.

15. The method according to claim 14, wherein mechanical polishing is performed in each of the planarizing steps.

16. The method according to claim 14, wherein the insulating layer is light interruptive.

17. The method according to claim 14, wherein the insulating layer is an organic resin film in which at least one of a black pigment and a carbon-type material is dispersed.

18. The method according to claim 14, wherein the semiconductor elements are thin-film transistors.

19. A method of manufacturing a semiconductor device comprising the steps of:

forming electrodes over a substrate having an insulating surface;

forming a diamond-like carbon film to cover the electrodes;

forming an insulating layer on the diamond-like carbon film; and planarizing the insulating layer so that a surface of the diamond-like carbon film and a surface of the insulating layer become flush with each other, thereby filling boundary portions between the electrodes with the insulating layer.

20. The method according to claim 19, wherein mechanical polishing is performed in the planarizing step.

21. The method according to claim 19, wherein the insulating layer is light interruptive.

22. The method according to claim 19, wherein the insulating layer is an organic resin film in which at least one of a black pigment and a carbon-type material is dispersed.

23. The method according to claim 19, further comprising a step of planarizing the electrodes before the step of forming the diamond-like carbon film.

24. The method according to claim 19, wherein the diamond-like carbon film has a thickness of 10 to 50 nm.

25. A method of manufacturing a semiconductor device comprising the steps of:

forming striped electrodes over a first substrate;

forming a diamond-like carbon film to cover the striped electrodes;

forming an insulating layer on the diamond-like carbon film;

planarizing the insulating layer so that a surface of the diamond-like carbon film and a surface of the insulating layer become flush with each other, thereby filling boundary portions between the striped electrodes with the insulating layer; and forming a liquid crystal layer between the first substrate and a second transparent substrate.

26. The method according to claim 25, wherein mechanical polishing is performed in the planarizing step.

27. The method according to claim 23, wherein the insulating layer is light interruptive.

28. The method according to claim 25, wherein the insulating layer is an organic resin film in which at least one of a black pigment and a carbon-type material is dispersed.

29. The method according to claim 25, further comprising a step of planarizing the striped electrodes before the step of forming the diamond-like carbon film.

30. The method according to claim 25, wherein the diamond-like carbon film has a thickness of 10 to 50 nm.

31. A method of manufacturing a semiconductor device comprising the steps of:

forming semiconductor elements over a substrate having an insulating surface;

forming pixel electrodes that are electrically connected to the respective semiconductor elements;

forming a diamond-like carbon film to cover the pixel electrodes;

forming an insulating layer on the diamond-like carbon film; and planarizing the insulating layer so that a surface of the diamond-like carbon film and a surface of the insulating layer become flush with each other, thereby filling boundary portions between the pixel electrodes with the insulating layer.

32. The method according to claim 31, wherein mechanical polishing is performed in the planarizing step.

33. The method according to claim 31, wherein the insulating layer is light interruptive.

34. The method according to claim 31, wherein the insulating layer is an organic resin film in which at least one of a black pigment and a carbon-type material is dispersed.

35. The method according to claim 31, wherein the semiconductor elements are thin-film transistors.

36. The method according to claim 31, further comprising a step of planarizing the pixel electrodes before the step of forming the diamond-like carbon film.

37. The method according to claim 31, wherein the diamond-like carbon film has a thickness of 10 to 50 nm.

38. A method of manufacturing a semiconductor device comprising the steps of:

forming semiconductor elements arranged in matrix form over a substrate;

forming pixel electrodes connected to the respective semiconductor elements, with at least one interlayer insulating film interposed therebetween;

forming a diamond-like carbon film to cover the pixel electrodes;

forming an insulating layer on the diamond-like carbon film;

planarizing the insulating layer so that a surface of the diamond-like carbon film and a surface of the insulating layer become flush with each other, thereby filling boundary portions between the pixel electrodes with the insulating layer; and forming a liquid crystal layer over the insulating layer.

39. The method according to claim 38, wherein mechanical polishing is performed in the planarizing step.

40. The method according to claim 38, wherein the insulating layer is light interruptive.

41. The method according to claim 38, wherein the insulating layer is an organic resin film in which at least one of a black pigment and a carbon-type material is dispersed.

42. The method according to claim 38, wherein the semiconductor elements are thin-film transistors.

43. The method according to claim 38, further comprising a step of planarizing the pixel electrodes before the step of forming the diamond-like carbon film.

44. The method according to claim 38, wherein the diamond-like carbon film has a thickness of 10 to 50 nm.

* * * * *